United States Patent
Yamazaki et al.

(10) Patent No.: US 10,212,368 B2
(45) Date of Patent: Feb. 19, 2019

(54) SOLID-STATE IMAGING DEVICE

(71) Applicant: HAMAMATSU PHOTONICS K.K., Hamamatsu-shi, Shizuoka (JP)

(72) Inventors: Tomohiro Yamazaki, Hamamatsu (JP); Takashi Suzuki, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/739,870

(22) PCT Filed: Jun. 24, 2016

(86) PCT No.: PCT/JP2016/068856
§ 371 (c)(1),
(2) Date: Dec. 26, 2017

(87) PCT Pub. No.: WO2017/002730
PCT Pub. Date: Jan. 5, 2017

(65) Prior Publication Data
US 2018/0191968 A1 Jul. 5, 2018

(30) Foreign Application Priority Data
Jun. 30, 2015 (JP) .................. 2015-130754

(51) Int. Cl.
*H04N 5/32* (2006.01)
*H04N 5/341* (2011.01)
(Continued)

(52) U.S. Cl.
CPC .............. *H04N 5/341* (2013.01); *G01T 1/20* (2013.01); *H01L 27/14* (2013.01); *H01L 27/146* (2013.01);
(Continued)

(58) Field of Classification Search
None
See application file for complete search history.

(56) References Cited

U.S. PATENT DOCUMENTS 8,625,741 B2 * 1/2014 Kyushima .............. H04N 5/378
378/98.8
2010/0182465 A1 7/2010 Okita
(Continued)

FOREIGN PATENT DOCUMENTS

| JP | H05-340810 A | 12/1993 |
| JP | H09-247536 A | 9/1997 |

(Continued)

OTHER PUBLICATIONS

International Preliminary Report on Patentability dated Jan. 11, 2018 for PCT/JP2016/068856.

*Primary Examiner* — Yara B Green
(74) *Attorney, Agent, or Firm* — Drinker Biddle & Reath LLP

(57) ABSTRACT

A solid-state imaging device includes a photodetecting unit and a signal readout unit, and further includes a control unit controlling an operation of each of the photodetecting unit and the signal readout unit. The photodetecting unit includes M×N pixels on a first principal surface of a semiconductor substrate having the first principal surface and a second principal surface opposite to each other. Each pixel includes a plurality of buried photodiodes, a capacitance portion a plurality of transfer switches, and an output switch.

9 Claims, 17 Drawing Sheets

(51) Int. Cl.
*G01T 1/20* (2006.01)
*H01L 27/14* (2006.01)
*H01L 27/146* (2006.01)
*H04N 5/357* (2011.01)
*H04N 5/374* (2011.01)
*H04N 5/372* (2011.01)
*H04N 5/378* (2011.01)

(52) U.S. Cl.
CPC ............... *H04N 5/32* (2013.01); *H04N 5/357* (2013.01); *H04N 5/372* (2013.01); *H04N 5/374* (2013.01); *H04N 5/378* (2013.01)

(56) References Cited

U.S. PATENT DOCUMENTS

| | | |
|---|---|---|
| 2013/0033631 A1 | 2/2013 | Mabuchi |
| 2013/0292549 A1* | 11/2013 | Fujita ................ H01L 27/14658 250/208.1 |
| 2015/0083924 A1 | 3/2015 | Okada et al. |
| 2015/0138367 A1 | 5/2015 | Simolon et al. |

FOREIGN PATENT DOCUMENTS

| | | |
|---|---|---|
| JP | 2719058 B2 | 2/1998 |
| JP | 2000-32342 A | 1/2000 |
| JP | 3825503 B2 | 9/2006 |
| JP | 2008-17019 A | 1/2008 |
| JP | 2009-246948 A | 10/2009 |
| JP | 2010-28423 A | 2/2010 |
| JP | 2011-239070 A | 11/2011 |
| JP | 4878123 B2 | 2/2012 |
| JP | 2014-179664 A | 9/2014 |

* cited by examiner

SOLID-STATE IMAGING DEVICE

TECHNICAL FIELD

The present invention relates to a solid-state imaging device.

BACKGROUND ART

A solid-state imaging device includes a photodetecting unit having a plurality of pixels on a principal surface of a semiconductor substrate, and a signal readout unit that reads out a charge from each of the plurality of pixels and outputs a signal value according to an amount of charge (see Patent Documents 1 to 5). Each of the plurality of pixels includes a photodiode that generates a charge according to light incidence. The signal readout unit includes an integration circuit in which an integration capacitance portion is provided between an input terminal and an output terminal of an amplifier, accumulates a charge generated in the photodiode of each pixel in the integration capacitance portion, and outputs a signal value according to an amount of accumulated charge.

CITATION LIST

Patent Literature

Patent Document 1: Japanese Patent Application Laid-Open Publication No. 2000-32342
Patent Document 2: Japanese Patent Application Laid-Open Publication No. H9-247536
Patent Document 3: Japanese Patent Publication No. 2719058
Patent Document 4: Japanese Patent Publication No. 4878123
Patent Document 5: Japanese Patent Publication No. 3825503

SUMMARY OF INVENTION

Technical Problem

A solid-state imaging device described in Patent Document 1 includes an integration circuit common to a plurality of pixels. A solid-state imaging device having such a configuration accumulates a charge generated in a photodiode according to light incidence in each of a plurality of pixels in a junction capacitance portion of the photodiode, sequentially transfers the charge accumulated in the junction capacitance portion of the photodiode of each pixel to an integration capacitance portion of the common integration circuit, and outputs a signal value according to an amount of charge from the integration circuit.

When unread charges remain in the junction capacitance portion when the charge is transferred from the junction capacitance portion of the photodiode of each pixel to the integration capacitance portion of the integration circuit, an S/N ratio and linearity of light detection deteriorate. To solve such a problem, a buried photodiode may be used as the photodiode of each pixel. When the buried photodiode is used with full depletion, junction capacitance decreases, an output voltage changes linearly with respect to an amount of accumulated charge, and a charge generated in a pn junction portion can be almost completely read out such that the S/N ratio and linearity in light detection are excellent.

However, the buried photodiode has higher resistance than a normal photodiode. Further, an area of a light detection region of a photodiode of a solid-state imaging device in medical applications (for example, for X-ray detection in X-ray CT) is about 100 times that of a usual application (for example, for capturing an optical image in a digital camera). When such a buried photodiode having a large area and high resistance is used, a charge readout time from the junction capacitance portion of the photodiode is lengthened.

The present invention has been made in order to solve the above problem, and an object thereof is to provide a solid-state imaging device which can shorten a charge readout time from a junction capacitance portion of a photodiode of each pixel and which has an excellent S/N ratio and linearity in light detection.

Solution to Problem

A solid-state imaging device according to the present invention includes a photodetecting unit including a plurality of pixels on a first principal surface of a semiconductor substrate having the first principal surface and a second principal surface opposite to each other; a signal readout unit outputting a signal value according to an amount of charge Output from each of the plurality of pixels; and a control unit controlling an operation of each of the photodetecting unit and the signal readout unit. Further, each of the plurality of pixels includes a plurality of buried photodiodes each of which generates a charge according to light incidence and accumulates the charge in a junction capacitance portion; a capacitance portion accumulating the charge transferred from the junction capacitance portion of each of the plurality of photodiodes; a transfer switch group for transferring the charge from the junction capacitance portion of each of the plurality of photodiodes to the capacitance portion; and an output switch for outputting the charge from the capacitance portion to the signal readout unit. Further, the control unit controls so as to accumulate the charge generated according to the light incidence in each of the plurality of pixels in the junction capacitance portion of each photodiode during a common charge accumulation period, transfer the charge from the junction capacitance portion of each photodiode to the capacitance portion by setting the transfer switch group to an ON state in each of the plurality of pixels after the charge accumulation period, and output the charge from the capacitance portion to the signal readout unit by sequentially setting the output switch to an ON state in each of the plurality of pixels after charge transfer.

Advantageous Effects of Invention

According to the present invention, it is possible to provide a solid-state imaging device which can shorten a charge readout time from a junction capacitance portion of a photodiode of each pixel and which has an excellent S/N ratio and linearity in light detection.

DESCRIPTION OF EMBODIMENTS

Hereinafter, embodiments for carrying out the present invention will be described in detail with reference to the accompanying drawings. In the description of the drawings, the same or equivalent elements will be denoted by the same reference signs, without redundant description.

First Embodiment

Figure 1:
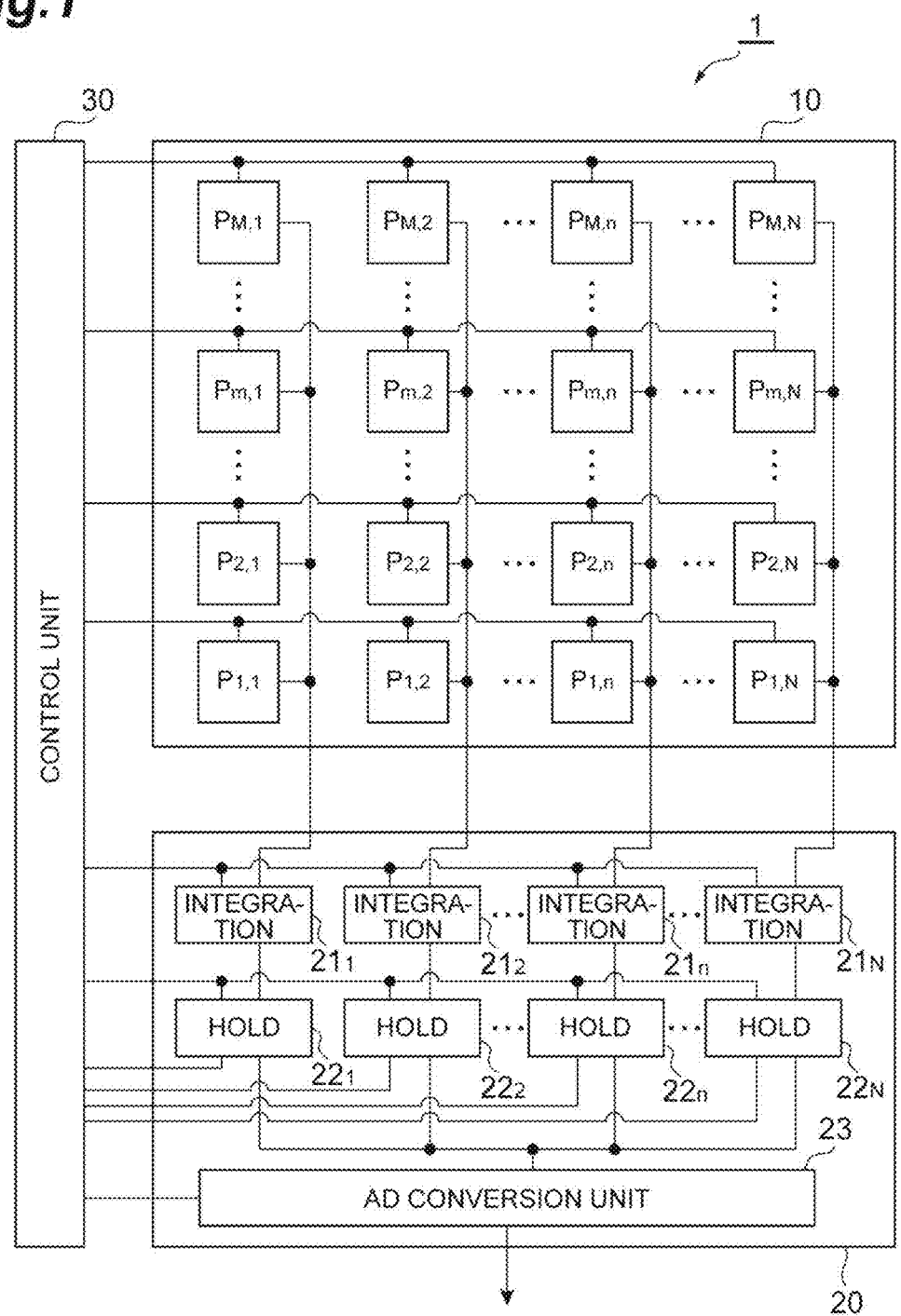
FIG. 1 is an entire configuration diagram of a solid-state imaging device 1 of a first embodiment.

FIG. 1 is an entire configuration diagram of a solid-state imaging device 1 of the first embodiment. The solid-state imaging device 1 includes a photodetecting unit 10 and a signal readout unit 20, and further includes a control unit 30 that controls respective operations of the photodetecting unit 10 and the signal readout unit 20.

The photodetecting unit 10 has M×N pixels $P_{1,1}$ to $P_{M,N}$ on a first principal surface of a semiconductor substrate having the first principal surface and a second principal surface opposite to each other. The M×N pixels $P_{1,1}$ to $P_{M,N}$ have a common configuration and are arrayed two-dimensionally. A pixel $P_{m,n}$ is located in an m-th row and an n-th column. Each pixel $P_{m,n}$ includes a photodiode that generates a charge according to light incidence and can output the charge. Here, M and N are each an integer of 2 or more. m is an integer of 1 or more and M or less. n is an integer of 1 or more and N or less.

The signal readout unit 20 outputs a signal value according to an amount of charge output from each of the M×N pixels $P_{1,1}$ to $P_{M,N}$. The signal readout unit 20 includes N integration circuits $21_1$ to $21_N$, N hold circuits $22_1$ to $22_N$, and an AD conversion circuit 23. The N integration circuits $21_1$ to $21_N$ have a common configuration. The N hold circuits $22_1$ to $22_N$ have a common configuration.

The n-th integration circuit $21_n$ inputs the charge sequentially output from each of the M pixels $P_{1,n}$ to $P_{M,n}$ of the n-th column, and outputs a voltage value according to the amount of charge to the hold circuit $22_n$. The n-th hold circuit $22_n$ inputs and holds the voltage value output from the integration circuit $21_n$. The N hold circuits $22_1$ to $22_N$ sequentially output voltage values held thereby to the AD conversion circuit 23.

The AD conversion circuit 23 inputs a voltage value sequentially output from each of the N hold circuits $22_1$ to $22_N$, converts the input voltage value into a digital value, and outputs the digital value. The digital value output from the AD conversion circuit 23 is a signal value according to an amount of charge output from each of the M×N pixels $P_{1,1}$ to $P_{M,N}$.

Figure 2:
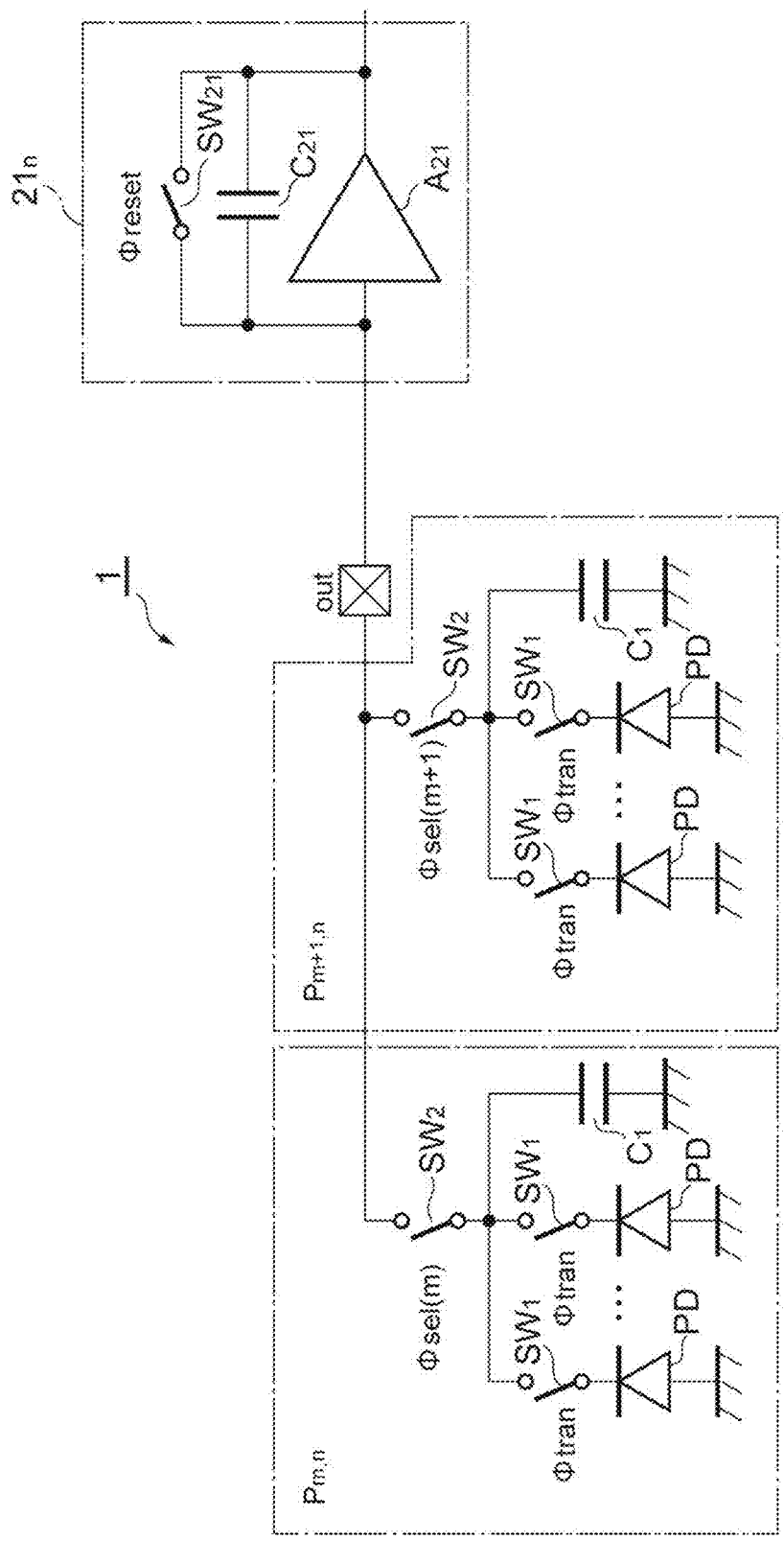
FIG. 2 is a circuit diagram of a pixel $P_{m,n}$ and an integration circuit $21_n$ of the solid-state imaging device 1 of the first embodiment.

FIG. 2 is a circuit diagram of the pixel $P_{m,n}$ and the integration circuit $21_n$ of the solid-state imaging device 1 of the first embodiment. FIG. 2 illustrates two pixels $P_{m,n}$ and $P_{m+1,n}$ of the n-th column as representatives of the M×N pixels $P_{1,1}$ to $P_{M,N}$, and illustrates the n-th integration circuit $21_n$ as a representative of the N integration circuits $21_1$ to $21_N$.

Each pixel $P_{m,n}$ includes a plurality of buried photodiodes PD, a capacitance portion $C_1$, a plurality of transfer switches $SW_1$, and an output switch $SW_2$. Each of the transfer switches $SW_1$ and the output switch $SW_2$ may be configured by a MOS transistor. Each photodiode PD can generate a charge according to the light incidence and accumulate the charge in a junction capacitance portion. The capacitance portion $C_1$ accumulates the charge transferred from the junction capacitance portion of each of the plurality of photodiodes PD via the transfer switch $SW_1$. In each pixel $P_{m,n}$, one capacitance portion $C_1$ may be provided or a plurality of partial capacitance portions may be provided in parallel.

Each transfer switch $SW_1$ is provided in a one-to-one correspondence with the photodiode PD. Each pair of the photodiode PD and the transfer switch $SW_1$ is provided in parallel to the capacitance portion $C_1$. Each transfer switch $SW_1$ can transfer the charge from the junction capacitance portion of the photodiode PD to the capacitance portion $C_1$ in an ON state. The output switch $SW_2$ can output the charge from the capacitance portion $C_1$ to the integration circuit $21_n$ of the signal readout unit 20 in an ON state.

Each integration circuit $21_n$ includes an amplifier $A_{21}$, a capacitance portion $C_{21}$, and an initialization switch $SW_{21}$. The capacitance portion $C_{21}$ and the initialization switch $SW_{21}$ are connected in parallel and are provided between an input terminal and an output terminal of the amplifier $A_{21}$.

The initialization switch $SW_{21}$ may be configured by a MOS transistor. When the initialization switch $SW_{21}$ is in an ON state, charge accumulation in the capacitance portion $C_{21}$ is initialized. When the initialization switch $SW_{21}$ is in an OFF state, the capacitance portion $C_{21}$ can accumulate the input charge. The integration circuit $21_n$ outputs a voltage value according to the amount of accumulated charge in the capacitance portion $C_{21}$.

An ON/OFF operation of the transfer switch $SW_1$ of each pixel $P_{m,n}$ is controlled by a control signal ϕtran output from the control unit 30. An ON/OFF operation of the output switch $SW_2$ of each pixel $P_{m,n}$ is controlled by a control signal ϕsel(m) output from the control unit 30. An ON/OFF operation of the initialization switch $SW_{21}$ of each integration circuit $21_n$ is controlled by a control signal ϕreset output from the control unit 30.

Figure 3:
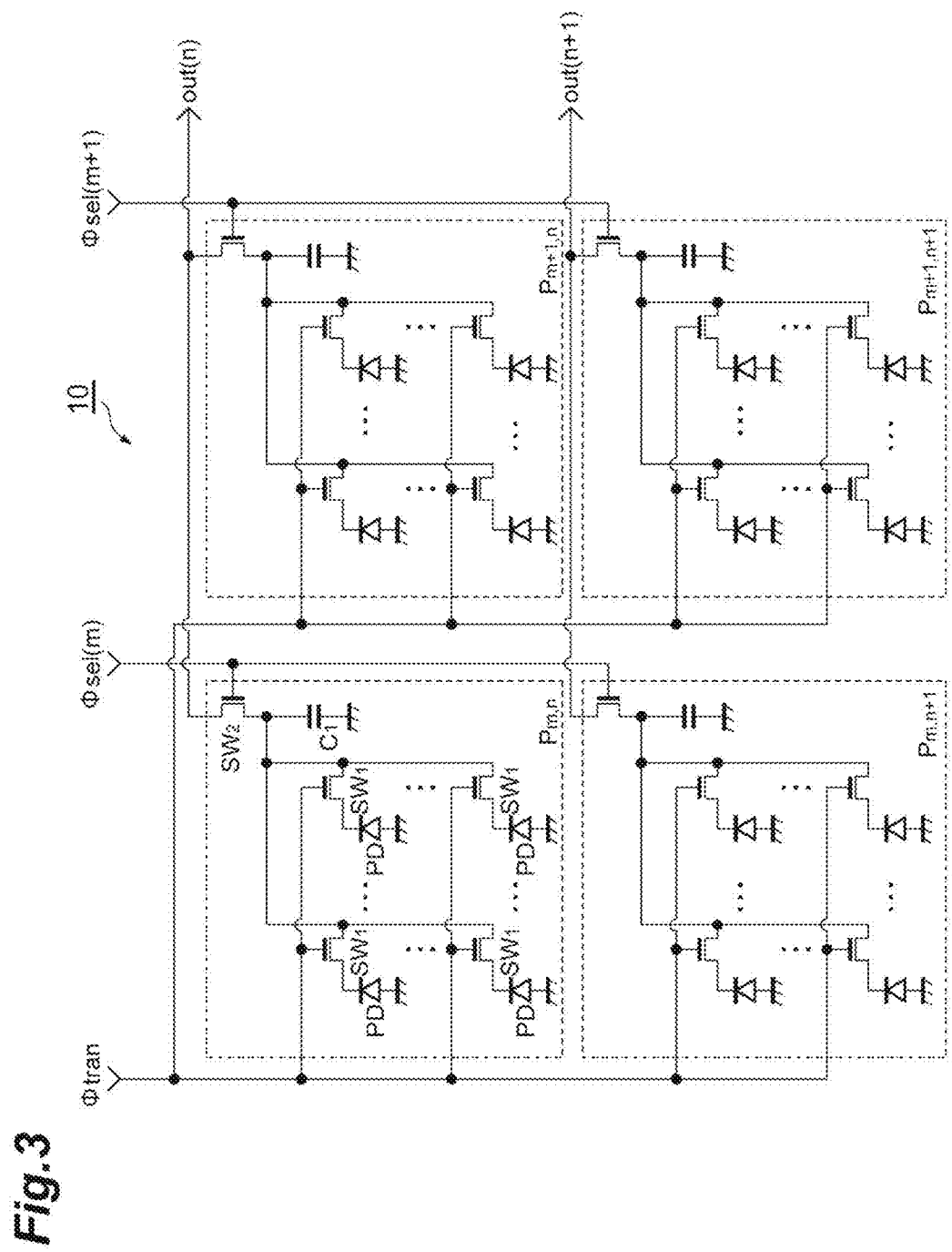
FIG. 3 is a circuit diagram of the pixel $P_{m,n}$, a pixel $P_{m+1,n}$, a pixel $P_{m,n+1}$, and a pixel $P_{m+1,n+1}$ of the solid-state imaging device 1 of the first embodiment.

FIG. 3 is a circuit diagram of the pixel $P_{m,n}$, the pixel $P_{m+1,n}$, a pixel $P_{m,n+1}$, and a pixel $P_{m+1,n+1}$ of the solid-state imaging device 1 of the first embodiment. FIG. 3 illustrates pixels of two rows and two columns as representatives of M rows and N columns.

The control unit 30 applies the common control signal ϕtran to the M×N pixels $P_{1,1}$ to $P_{M,N}$. The control signal ϕtran is a signal for controlling the ON/OFF operations of the transfer switches $SW_1$ of all of the pixels. The control unit 30 applies the common control signal ϕsel(m) to the N pixels $P_{m,1}$ to $P_{m,N}$ of the m-th row. The control signal ϕsel(m) is a signal for controlling the ON/OFF operations of the output switches $SW_2$ of the N pixels of the m-th row. A period in which the output switch $SW_2$ is in the ON state according to the control signal is different in the first to M-th rows. The n-th integration circuit $21_n$ inputs a charge signal out(n) sequentially output from the output switch $SW_2$ of each of the M pixels $P_{1,n}$ to $P_{M,n}$ of the n-th column.

Figure 4:
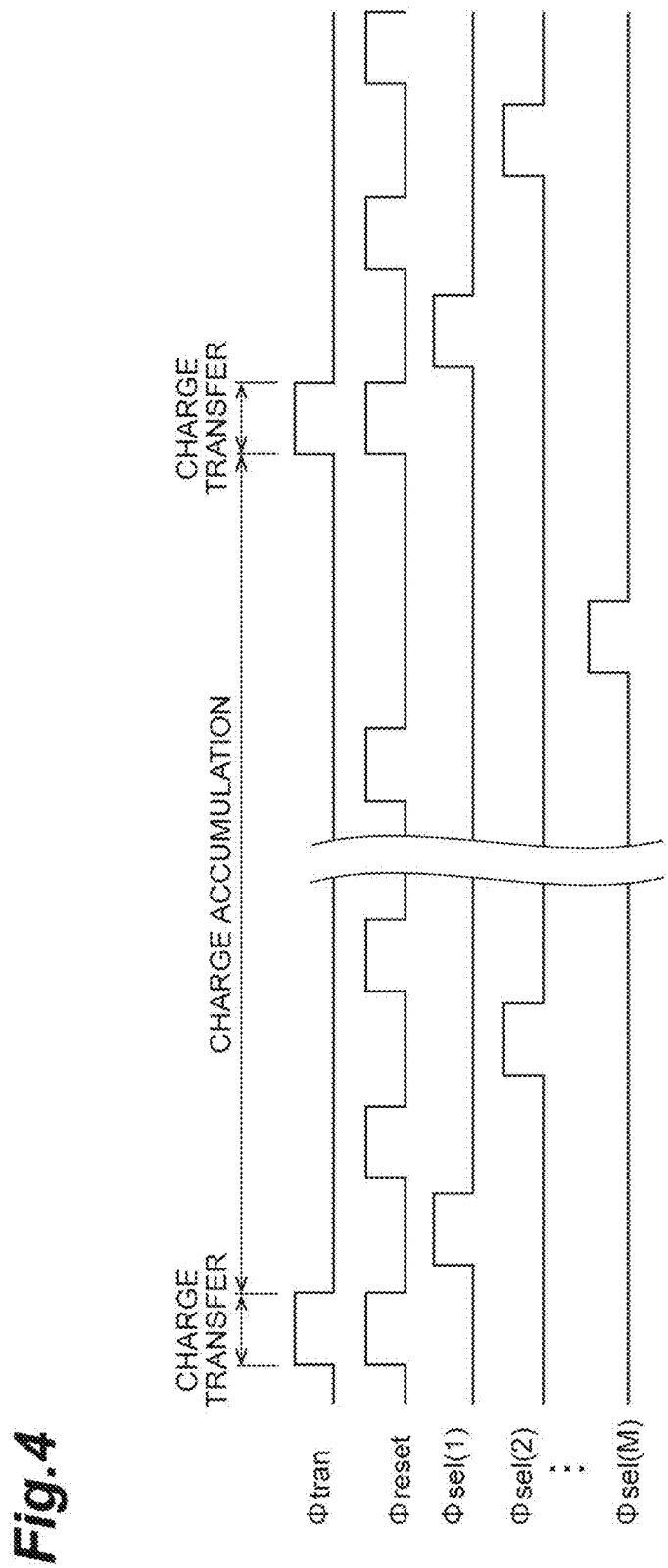
FIG. 4 is a timing chart illustrating an example of an operation of the solid-state imaging device 1 of the first embodiment.

FIG. 4 is a timing chart illustrating an example of an operation of the solid-state imaging device 1 of the first embodiment. FIG. 4 illustrates the control signal ϕtran to be applied to the transfer switch $SW_1$ of each pixel $P_{m,n}$, the control signal ϕreset to be applied to the initialization switch $SW_{21}$ of each integration circuit $21_n$, and the control signals ϕsel(1) to ϕsel(M) to be applied to the output switch $SW_2$ of the pixel $P_{m,n}$ of each row. Each switch is assumed to be in the ON state when the applied control signal has a high level.

The control signal ϕtran has the high level in a constant cycle, and the transfer switches $SW_1$ of all of the pixels alternately repeat the ON state period and the OFF state period in a constant cycle.

During a period (charge accumulation period) in which the control signal ϕtran has a low level, the transfer switches $SW_1$ are in the OFF state in all of the pixels, and the charge generated according to the light incidence on each photodiode PD is accumulated in the junction capacitance portion of the photodiode PD.

During a period in which the control signal ϕtran has the high level, the transfer switches $SW_1$ are in the ON state in all of the pixels, and further, the control signals ϕsel(1) to ϕsel(M) have the low level, and the output switches $SW_2$ are in the OFF state in all of the pixels. Thereby, in all of the pixels, the charge accumulated until then in the junction capacitance portion of each photodiode PD is transferred to the capacitance portion $C_1$ via the transfer switch $SW_1$.

The control signal ϕreset has the high level in the period in which the control signal ϕtran has the high level, and the control signal ϕreset also has the high level at a constant interval in a subsequent period (charge accumulation period) in which the control signal ϕtran has the low level. When the control signal ϕreset has the high level, the initialization switch $SW_{21}$ is in the ON state in each of the N integration circuits $21_1$ to $21_N$, and the charge accumulation in the capacitance portion $C_{21}$ is initialized.

Any one control signal ϕsel(m) of the control signals ϕsel(1) to ϕsel(M) has the high level in the period in which the control signal ϕreset has the low level. Thereby, the output switch $SW_2$ is in the ON state in each of the N pixels $P_{m,1}$ to $P_{m,N}$ of the m-th row to which the control signal ϕsel(m) having the high level is applied, and the charge accumulated in the capacitance portion $C_1$ is output as the charge signal out(n). The charge signal out(n) is input to the n-th integration circuit $21_n$ and accumulated in the capacitance portion $C_{21}$, and a voltage value according to the amount of accumulated charge is output from the integration circuit $21_n$.

That is, the control unit 30 causes the charge generated according to the light incidence to be accumulated in the junction capacitance portion of each photodiode PD in all of the pixels during the common charge accumulation period. After the charge accumulation period, the control unit 30 causes the charge to be transferred from the junction capacitance portion of each photodiode PD to the capacitance portion $C_1$ by setting the transfer switches $SW_1$ to the ON state in all of the pixels. Then, after the charge is transferred, the control unit 30 causes the charge to be output from the capacitance portion $C_1$ to the signal readout unit 20 by sequentially setting the output switches $SW_2$ to the ON state for respective rows. The control unit 30 can cause the charge to be output from the capacitance portion $C_1$ of each pixel to the signal readout unit 20 in the charge accumulation period in which the charge is accumulated in the junction capacitance portion of each photodiode PD.

Figure 5:
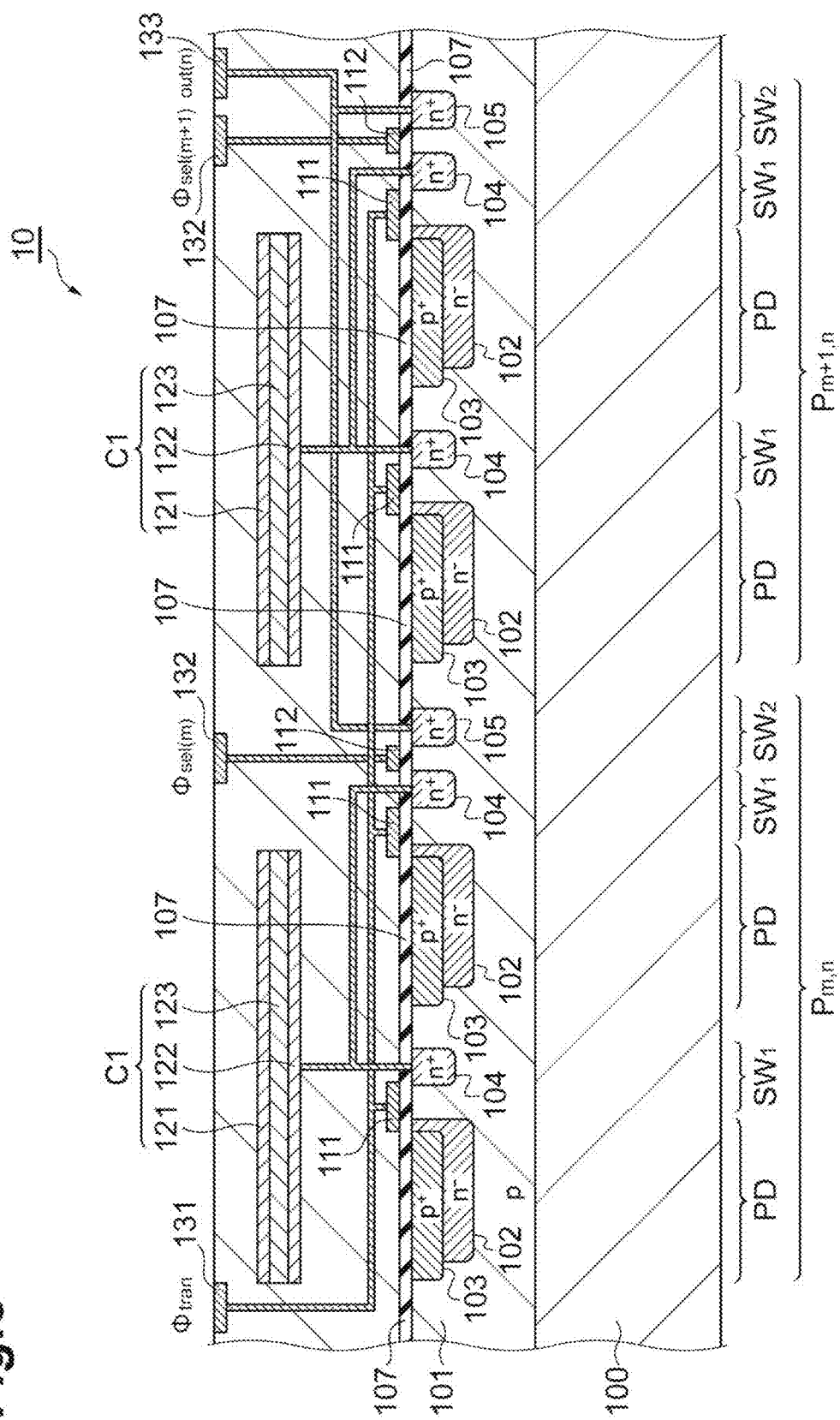
FIG. 5 is a diagram illustrating an example of a cross-sectional structure of a photodetecting unit 10 of the solid-state imaging device 1 of the first embodiment.

FIG. 5 is a diagram illustrating an example of a cross-sectional structure of the photodetecting unit 10 of the solid-state imaging device 1 of the first embodiment. FIG. 5 schematically illustrates an example of a cross-sectional structure of the two pixels $P_{m,n}$ and $P_{m+1,n}$ of the n-th column as representatives of the M×N pixels $P_{1,1}$ to $P_{M,N}$. Further, in FIG. 5, the number of photodiodes PD of each pixel $P_{m,n}$ is assumed to be 2.

The photodetecting unit 10 includes a p-type first semiconductor region 101, an n⁻-type second semiconductor region 102, a p⁺-type third semiconductor region 103, an n⁺-type fourth semiconductor region 104, an n⁺-type fifth semiconductor region 105, an insulator layer 107, gate electrodes 111 and 112, a first conductor layer 121, a second conductor layer 122, an insulator layer 123, and electrode pads 131 to 133, formed on the first principal surface (an upper surface in FIG. 5) of the semiconductor substrate 100.

The p-type first semiconductor region 101 is widely formed on the first principal surface of the semiconductor substrate 100. The n⁻-type second semiconductor region 102 is formed on a partial range of the p-type first semiconductor region 101. The p⁺-type third semiconductor region 103 is formed on both the p-type first semiconductor region 101 and the n⁻-type second semiconductor region 102. Each of the n⁺-type fourth semiconductor region 104 and the n⁺-type fifth semiconductor region 105 is formed on the p-type first semiconductor region 101. The insulator layer 107 is formed on substantially the entire semiconductor regions except a part thereof.

The gate electrode 111 is provided above the p-type first semiconductor region 101 between the n⁻-type second semiconductor region 102 and the n⁺-type fourth semiconductor region 104, and is formed on the insulator layer 107. The gate electrode 112 is provided above the p-type first semiconductor region 101 between the n⁺-type fourth semiconductor region 104 and the n$^+$-type fifth semiconductor region 105, and is formed on the insulator layer 107. The first conductor layer 121, the second conductor layer 122, and the insulator layer 123 are provided above the semiconductor regions and formed on the insulator layer 107.

The p-type first semiconductor region 101, the n$^-$-type second semiconductor region 102, and the p$^+$-type third semiconductor region 103 constitute the buried photodiode PD. The buried photodiode PD has an excellent S/N ratio and linearity in light detection.

The first conductor layer 121 and the second conductor layer 122 sandwiching the insulator layer 123 constitute the capacitance portion $C_1$ of an MIM (metal insulator metal) structure. For example, each of the first conductor layer 121 and the second conductor layer 122 is a metal layer or a polysilicon layer, and the insulator layer 123 is an oxide film such as $SiO_2$.

The p-type first semiconductor region 101, the n$^-$-type second semiconductor region 102, the n$^+$-type fourth semiconductor region 104, and the gate electrode 111 constitute a MOS transistor, which is the transfer switch $SW_1$. The gate electrode 111 is electrically connected to the electrode pad 131, and the control signal ϕtran is applied thereto via the electrode pad 131. The n$^+$-type fourth semiconductor region 104 is electrically connected to the second conductor layer 122.

The p-type first semiconductor region 101, the n$^+$-type fourth semiconductor region 104, the n$^+$-type fifth semiconductor region 105, and the gate electrode 112 constitute a MOS transistor, which is the output switch $SW_2$. The gate electrode 112 is electrically connected to the electrode pad 132, and the control signal ϕsel(m) is applied thereto via the electrode pad 132. The n$^+$-type fifth semiconductor region 105 is electrically connected to the electrode pad 133, and outputs the charge signal out(n) via the electrode pad 133.

Figure 6:
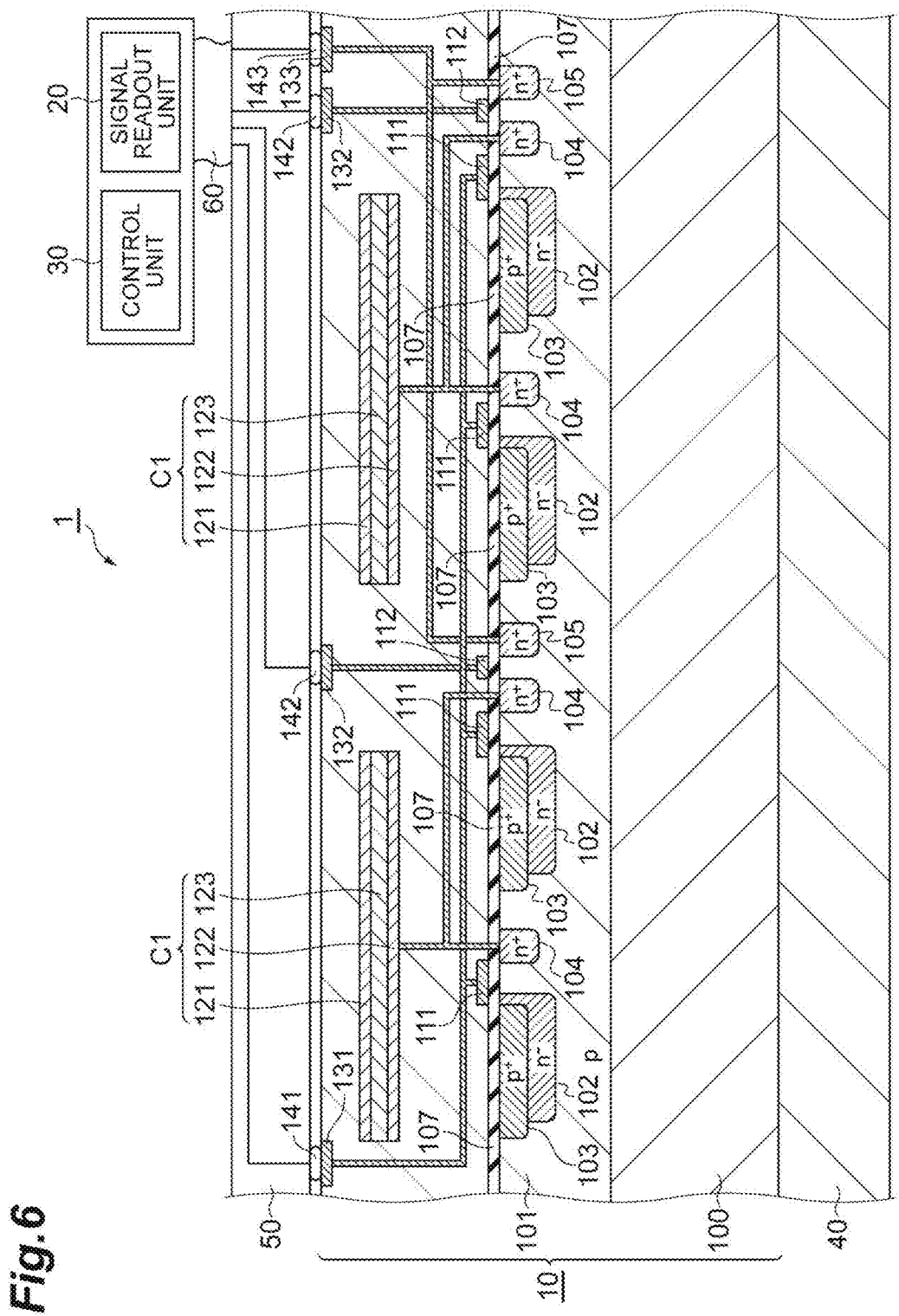
FIG. 6 is a diagram illustrating an example of a cross-sectional structure of the solid-state imaging device 1 of the first embodiment.

FIG. 6 is a diagram illustrating an example of a cross-sectional structure of the solid-state imaging device 1 of the first embodiment. FIG. 6 illustrates a cross-sectional view of the photodetecting unit 10, a scintillator layer 40, and a support substrate 50, and illustrates a block diagram of the signal readout unit 20 and the control unit 30.

The scintillator layer 40 is provided on the second principal surface (a lower surface in FIG. 6) side of the semiconductor substrate 100, and generates scintillation light according to the incidence of radiation (for example, X-rays or γ-rays). The support substrate 50 is provided on the first principal surface (an upper surface in FIG. 6) side of the semiconductor substrate 100, and supports the semiconductor substrate 100. Further, the support substrate 50, together with a cable 60 and bumps 141 to 143, electrically connects the signal readout unit 20 and the control unit 30 to the photodetecting unit 10. The cable 60 is provided between the signal readout unit 20 and the control unit 30, and the support substrate 50. The bumps 141 to 143 are provided between the electrode pads 131 to 133 and the support substrate 50.

Figure 7:
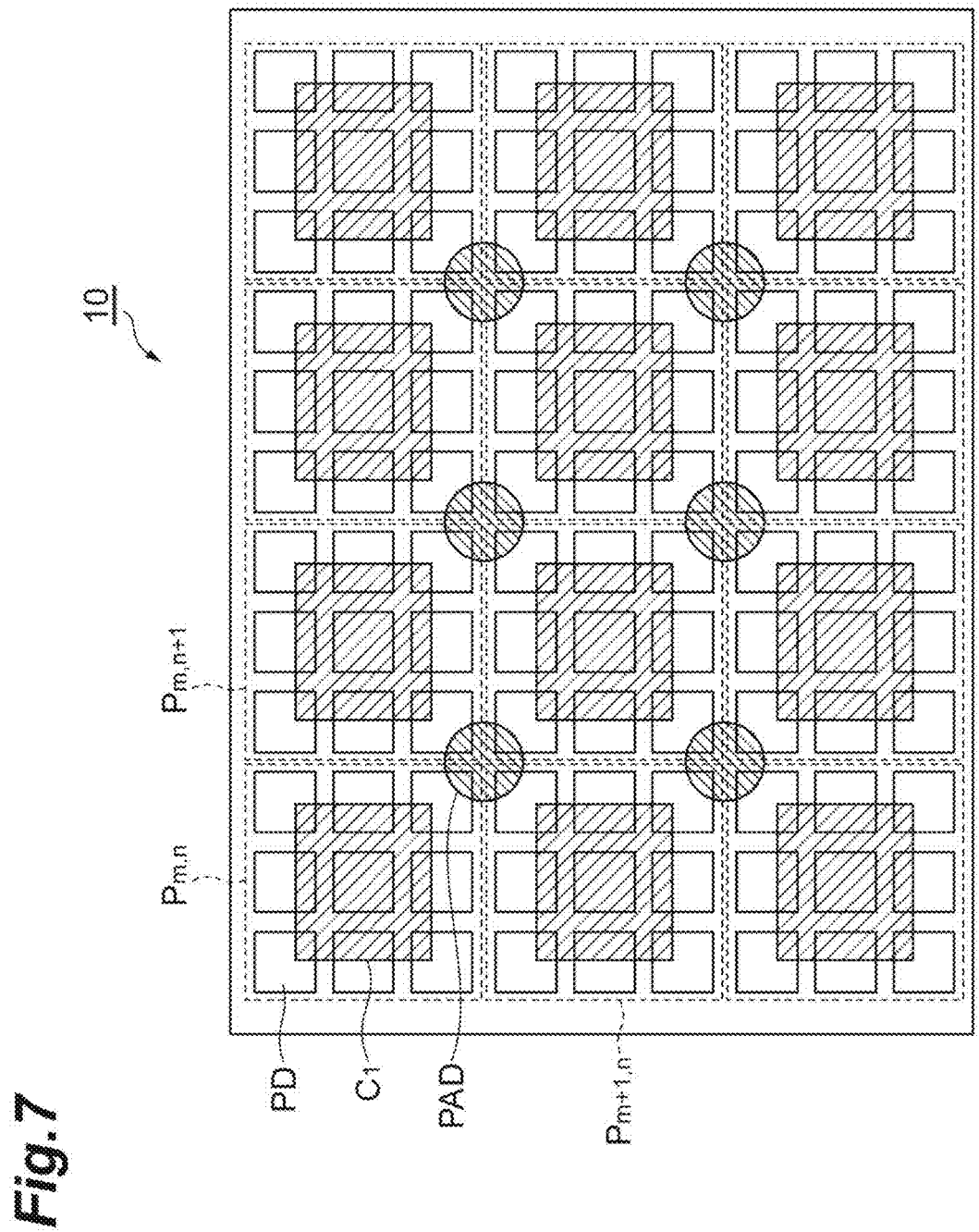
FIG. 7 is a view illustrating respective layout regions of a photodiode PD and a capacitance portion $C_1$ in the photodetecting unit 10.

FIG. 7 is a diagram illustrating respective layout regions of the photodiode PD and the capacitance portion $C_1$ in the photodetecting unit 10. FIG. 7 is a view when viewed in a direction perpendicular to the first principal surface of the semiconductor substrate 100. Further, in FIG. 7, the number of photodiodes PD in each pixel $P_{m,n}$ is assumed to be 9.

As illustrated in FIG. 7, in each pixel the layout region of the photodiode PD and the layout region of the capacitance portion $C_1$ of the MIM structure at least partially overlap. It is preferable for an electrode pad layout region PAD to not overlap the layout region of the capacitance portion $C_1$ and it is preferable to be provided in a region surrounded by pixels of 2 rows and 2 columns or in the vicinity thereof. In the electrode pad layout region PAD, the electrode pads 131 to 133 and other electrode pads are provided, and further, dummy pads may be provided.

Figure 8:
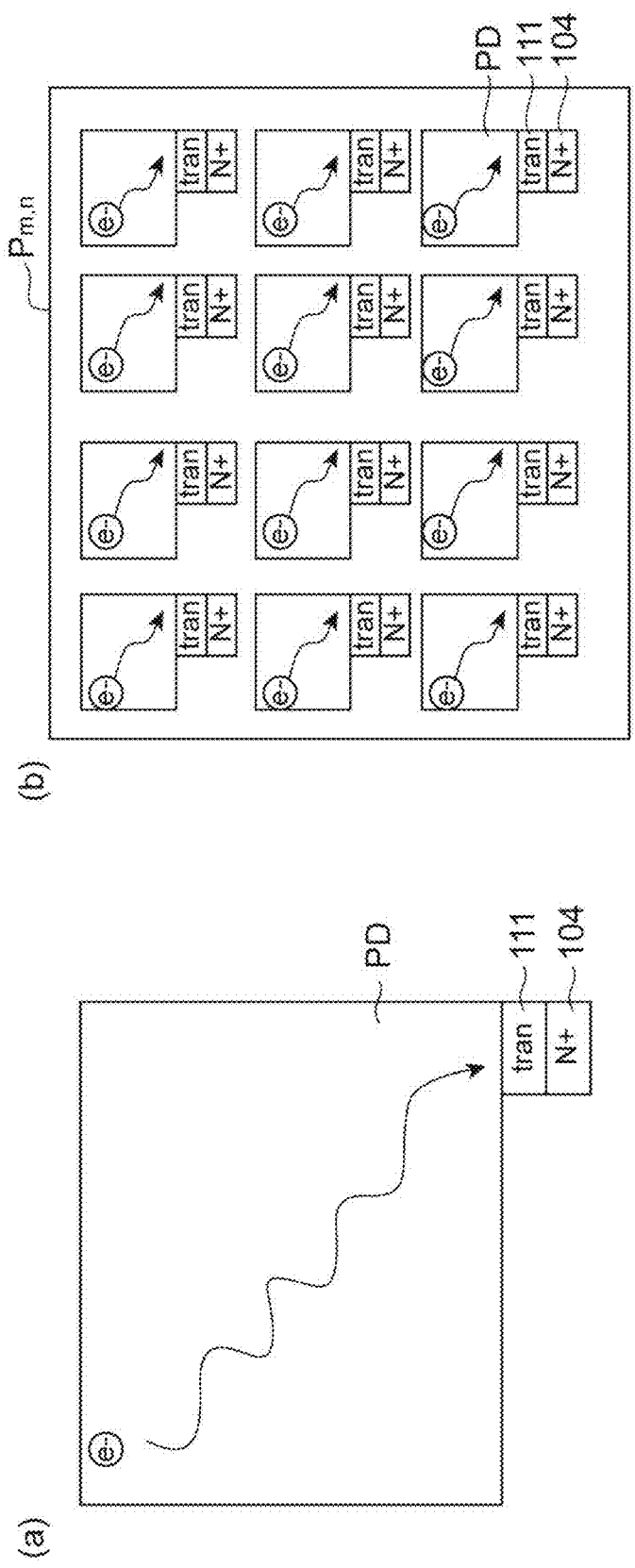
FIG. 8 is a diagram illustrating charge movement in each pixel $P_{m,n}$ of the photodetecting unit 10, and illustrates (a) a state of charge movement when each pixel $P_{m,n}$ includes one photodiode and (b) a state of charge movement when each pixel $P_{m,n}$ includes a plurality of photodiodes.

FIG. 8 is a diagram illustrating charge movement in each pixel $P_{m,n}$ of the photodetecting unit 10. (a) in FIG. 8 illustrates a state of charge movement when each pixel $P_{m,n}$ includes one photodiode. (b) in FIG. 8 illustrates a state of charge movement when each pixel $P_{m,n}$ includes a plurality (12 in (b) in FIG. 8) of photodiodes.

When a pixel having a large area light detection region using a buried photodiode PD which generally has high resistance is configured, as illustrated in (a) in FIG. 8, a charge readout time from a junction capacitance portion of the photodiode PD is long because a movement distance of the charge in the photodiode PD is long in a comparative example in which each pixel $P_{m,n}$ includes one photodiode PD.

On the other hand, as illustrated in (b) in FIG. 8, because a movement distance of the charge in each of the photodiodes PD is short in the present embodiment in which each pixel $P_{m,n}$ includes a plurality of photodiodes PD, the charge readout time from the junction capacitance portion of each photodiode PD to the capacitance portion $C_1$ is shortened. Therefore, in the solid-state imaging device 1 of the present embodiment, even when the light detection region of each pixel $P_{m,n}$ has a large area, it is possible to shorten the charge readout time from the junction capacitance portion of each photodiode PD. Such a solid-state imaging device 1 is suitable for medical use.

In the solid-state imaging device 1 of the present embodiment, because a buried photodiode is provided as the photodiode PD of each pixel $P_{m,n}$, unread charges do not remain when the charge is transferred from the junction capacitance portion of the photodiode PD to the capacitance portion $C_1$, and the S/N ratio and linearity in light detection are excellent. Because the capacitance portion $C_1$ of each pixel $P_{m,n}$ is provided with the MIM structure on the semiconductor substrate 100, it is possible to output a large amount of charge from the capacitance portion $C_1$ to the signal readout unit 20 without saturation. Because the layout region of the photodiode PD and the layout region of the capacitance portion $C_1$ at least partially overlap each other in each pixel $P_{m,n}$, the light detection region of each photodiode PD can have a large area, and the capacitance portion $C_1$ can have a large area and a large capacitance.

In the solid-state imaging device 1 of the present embodiment, when the first conductor layer 121 and the second conductor layer 122 of the capacitance portion $C_1$ are opaque or when the scintillator layer is provided on the second principal surface side of the semiconductor substrate 100, as illustrated in FIG. 6, it is possible to detect light incident from the second principal surface side of the semiconductor substrate 100 (backside incidence). Further, in light subjected to backside incidence, light which is not absorbed by the photodiode PD and reaches the first conductor layer 121 or the second conductor layer 122 of the capacitance portion $C_1$ is reflected by the capacitance portion $C_1$ and is incident on the photodiode PD again so that efficiency of photoelectric conversion is improved. Here, when the first conductor layer 121 and the second conductor layer 122 of the capacitance portion $C_1$ and the other layers are transparent, light may be incident from either the first principal surface side or the second principal surface side of the semiconductor substrate 100.

Further, in the solid-state imaging device 1 of the present embodiment, it is easy to arrange (tile) a plurality of semiconductor substrates each having the photodetecting unit 10 formed thereon in parallel, and it is possible to easily arrange a plurality of pixels at a constant pitch over the entire photodetecting unit 10 when tiling is performed. Even if each semiconductor substrate on which the photodetecting unit 10 is formed does not have a large area and a large number of pixels, it is possible to realize the photodetecting unit 10 with a large area and a large number of pixels as a whole by tiling. Further, because each semiconductor substrate on which the photodetecting unit 10 is formed can have a small area, improvement in manufacturing yield can be expected.

Second Embodiment

A solid-state imaging device 2 of the second embodiment is similar to the solid-state imaging device 1 of the first embodiment in terms of the entire configuration illustrated in FIG. 1, the examples of the cross-sectional structures illustrated in FIG. 5 and FIG. 6, and the layout regions of the photodiode PD and the capacitance portion $C_1$ illustrated in FIG. 7. However, the solid-state imaging device 2 of the second embodiment is different from the solid-state imaging device 1 of the first embodiment in terms of the circuit configuration of each pixel $P_{m,n}$.

Figure 9:
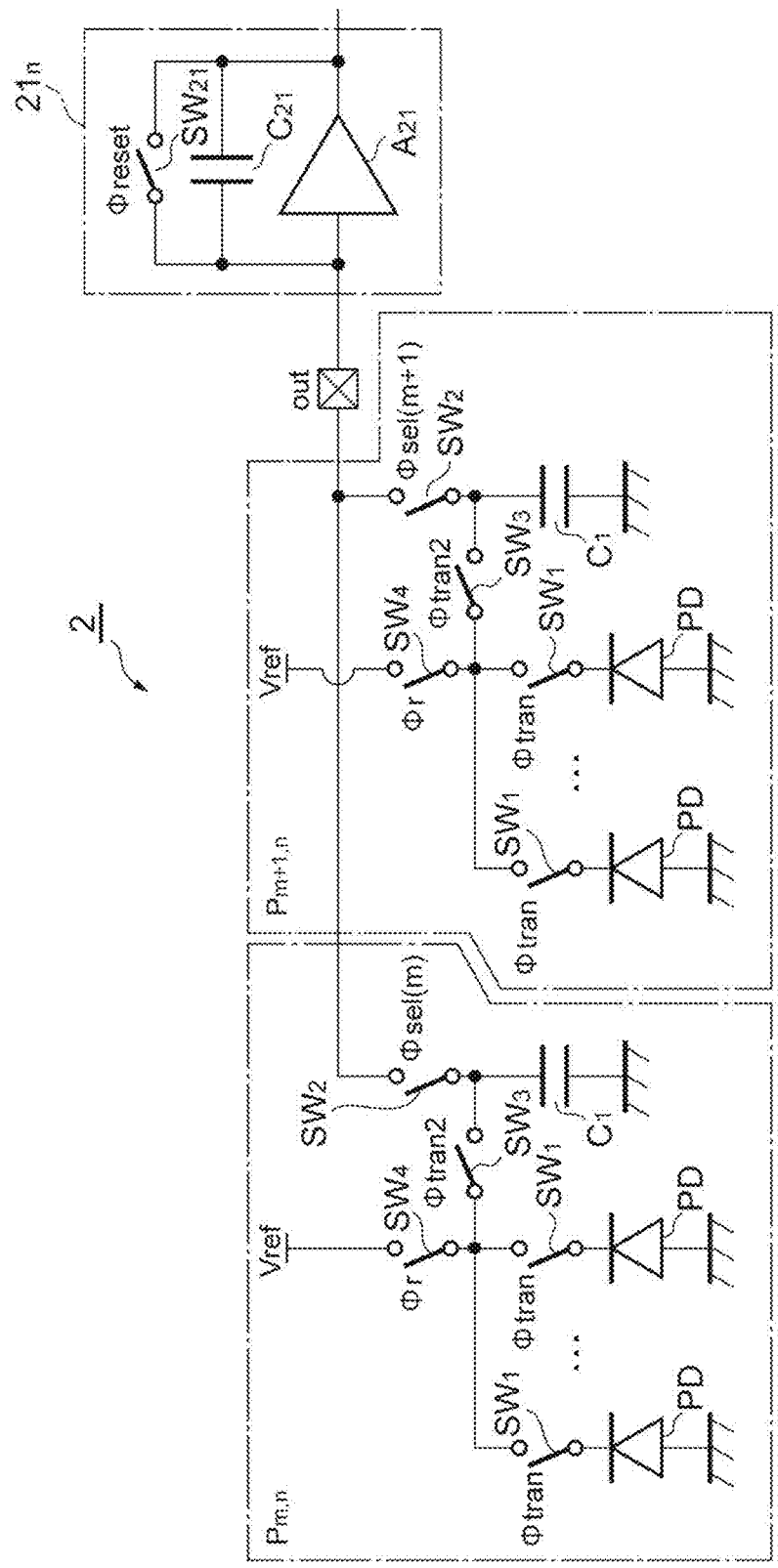
FIG. 9 is a circuit diagram of a pixel $P_{m,n}$ and an integration circuit $21_n$ of a solid-state imaging device 2 of a second embodiment.

FIG. 9 is a circuit diagram of a pixel $P_{m,n}$ and an integration circuit $21_n$ of the solid-state imaging device 2 of the second embodiment. FIG. 9 illustrates two pixels $P_{m,n}$ and $P_{m+1,n}$ of an n-th column as representatives of M×N pixels $P_{1,1}$ to $P_{M,N}$, and illustrates an n-th integration circuit $21_n$ as a representative of N integration circuits $21_1$ to $21_N$.

The pixel $P_{m,n}$ in the second embodiment illustrated in FIG. 9 is different from the pixel $P_{m,n}$ in the first embodiment illustrated in FIG. 2 in that a second transfer switch $SW_3$ and an initialization switch $SW_4$ are further included. Each of the second transfer switch $SW_3$ and the initialization switch $SW_4$ may also be configured by a MOS transistor.

The second transfer switch $SW_3$ is, provided between a transfer switch $SW_1$ and a capacitance portion $C_1$. When both the transfer switch $SW_1$ and the second transfer switch $SW_3$ are in an ON state, the charge can be transferred from a junction capacitance portion of a photodiode PD to the capacitance portion $C_1$. The initialization switch $SW_4$ is provided between a reference potential terminal to which a reference potential Vref is applied and the transfer switch $SW_1$. The initialization switch $SW_4$ can initialize charge accumulation in the junction capacitance portion of each photodiode PD when the switch is in the ON state.

An ON/OFF operation of the second transfer switch $SW_3$ of each pixel $P_{m,n}$ is controlled by a control signal ϕtran2 output from a control unit 30. An ON/OFF operation of the initialization switch $SW_4$ of each pixel $P_{m,n}$ is controlled by a control signal ϕr output from the control unit 30.

Figure 10:
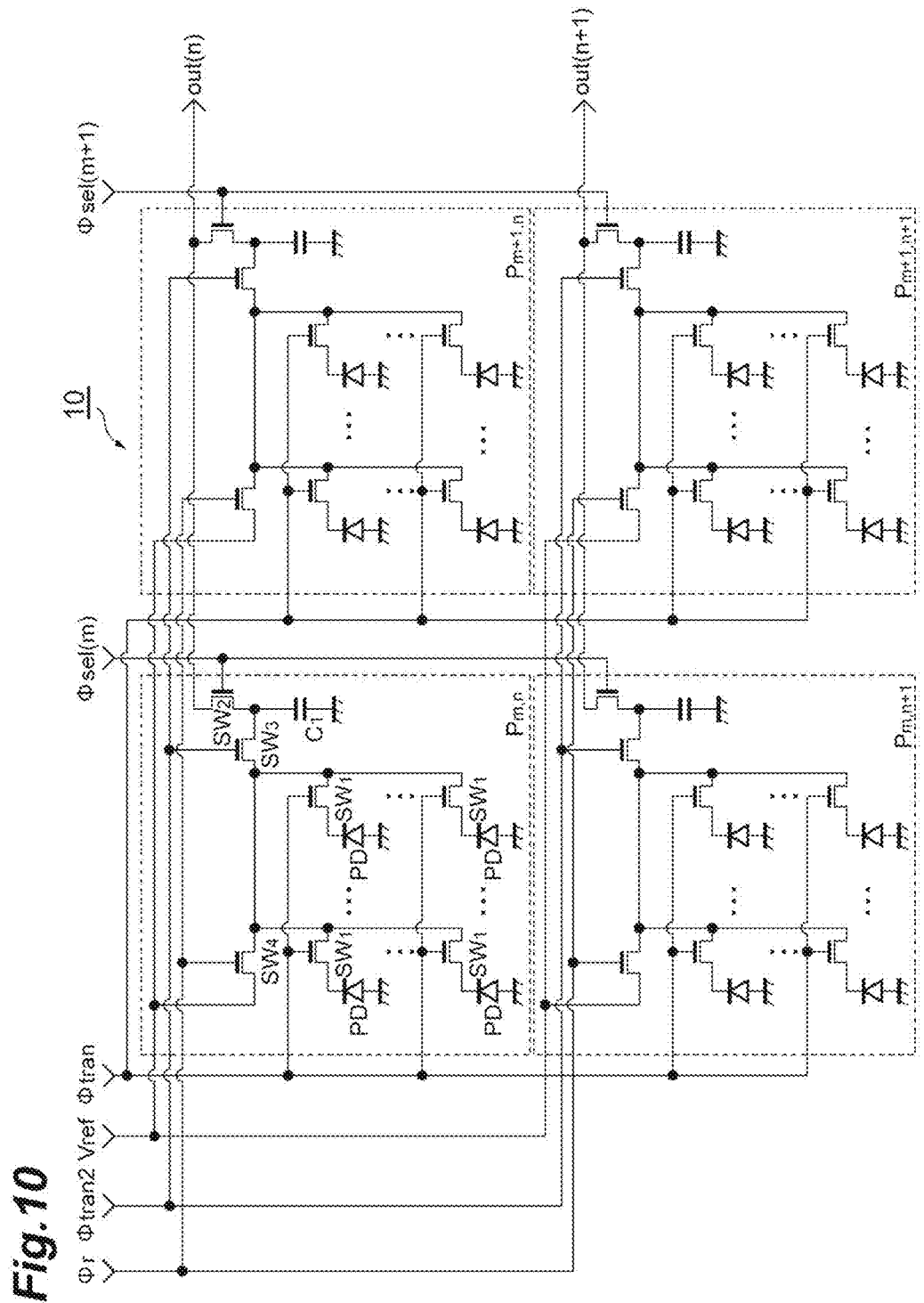
FIG. 10 is a circuit diagram of the pixel $P_{m,n}$, a pixel $P_{m+1,n}$, a pixel $P_{m,n+1}$, and a pixel $P_{m+1,n+1}$ of the solid-state imaging device 2 of the second embodiment.

FIG. 10 is a circuit diagram of the pixel $P_{m,n}$, the pixel $P_{m+1,n}$, a pixel $P_{m,n+1}$, and a pixel $P_{m+1,n+1}$ of the solid-state imaging device 2 of the second embodiment. FIG. 10 illustrates pixels of 2 rows and 2 columns as representatives of M rows and N columns.

A control signal ϕtran, a control signal ϕsel(m), and a charge signal out(n) are similar to those in the first embodiment. The control unit 30 applies the common control signal ϕtran2 to the M×N pixels $P_{1,1}$ to $P_{M,N}$. The control signal ϕtran2 is a signal for controlling the ON/OFF operations of the second transfer switches $SW_3$ of all of the pixels. The control unit 30 applies the common control signal ϕr to the M×N pixels $P_{1,1}$ to $P_{M,N}$. The control signal ϕr is a signal for controlling the ON/OFF operations of the initialization switches $SW_4$ of all of the pixels.

Figure 11:
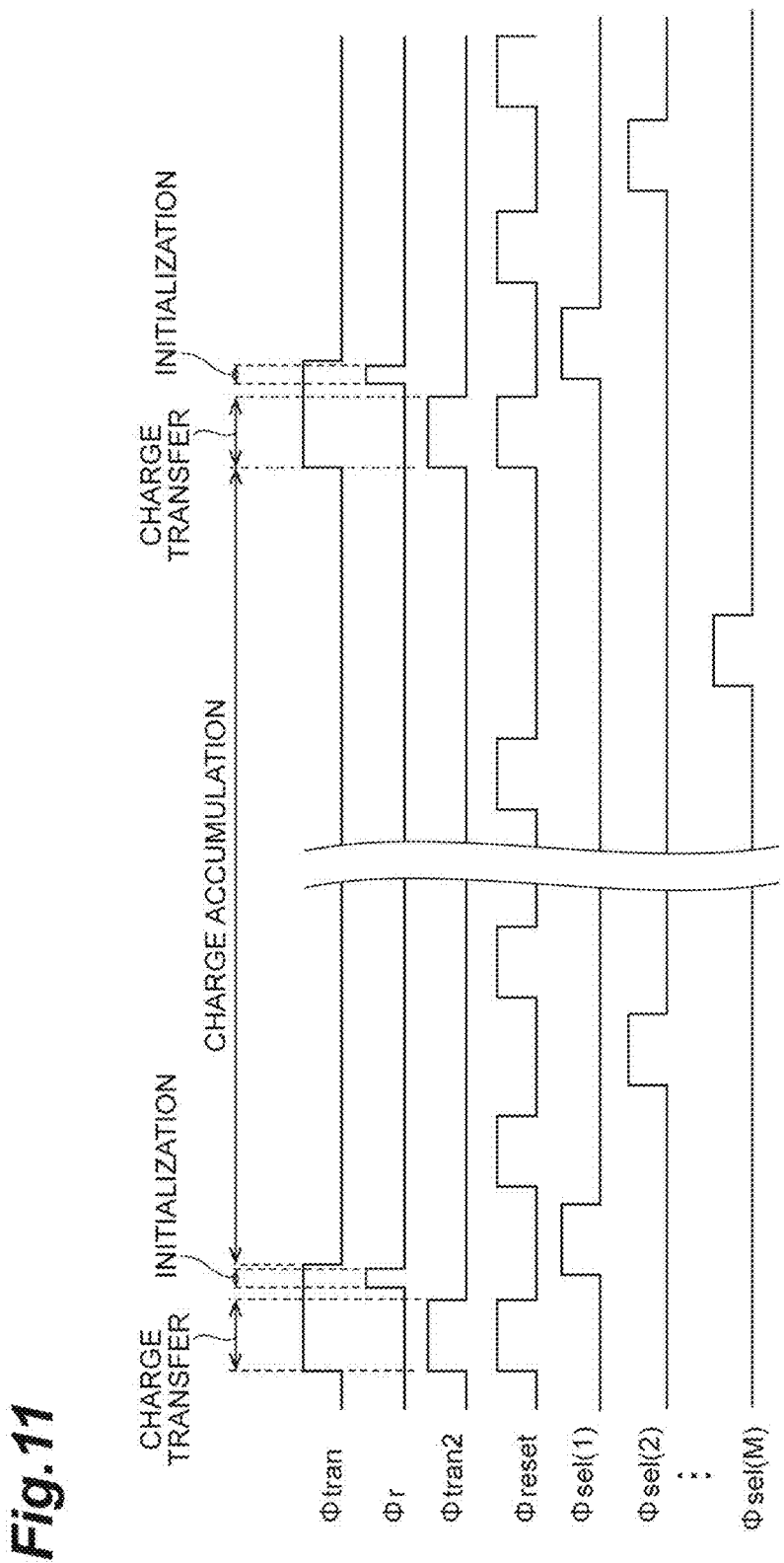
FIG. 11 is a timing chart illustrating an example of an operation of the solid-state imaging device 2 of the second embodiment.

FIG. 11 is a timing chart illustrating an example of an operation of the solid-state imaging device 2 of the second embodiment. FIG. 11 illustrates the control signal ϕtran to be applied to the transfer switch $SW_1$ of each pixel $P_{m,n}$, the control signal ϕr to be applied to the initialization switch $SW_4$ of each pixel $P_{m,n}$, the control signal ϕtran2 to be applied to the second transfer switch $SW_3$ of each pixel $P_{m,n}$, the control signal ϕreset to be applied to the initialization switch $SW_{21}$ of each integration circuit $21_n$, and the control signals ϕsel(1) to ϕsel(M) to be applied to the output switch $SW_2$ of the pixel $P_{m,n}$ of each row. Each switch is assumed to be in the ON state when the applied control signal has a high level.

The control signal ϕtran has the high level in a constant cycle, and the transfer switches $SW_1$ of all of the pixels alternately repeat the ON state period and the OFF state period in a constant cycle.

During a period (charge accumulation period) in which the control signal ϕtran has a low level, the transfer switches $SW_1$ are in the OFF state in all of the pixels, and the charge generated according to the light incidence on each photodiode PD is accumulated in the junction capacitance portion of the photodiode PD.

During a period in which the control signal ϕtran has the high level, the transfer switches $SW_1$ are in the ON state in all of the pixels. In a partial period of this period, the control signals ϕsel(1) to ϕsel(M) have the low level, and the output switches $SW_2$ are in the OFF state in all of the pixels. The control signal ϕtran2 has the high level, and the second transfer switches $SW_3$ are in the ON state in all of the pixels. Further, the control signal ϕr has the low level, and the initialization switches $SW_4$ are in the OFF state in all of the pixels. Thereby, in all of the pixels, the charge accumulated until then in the junction capacitance portion of each photodiode PD is transferred to the capacitance portion $C_1$ via the transfer switch $SW_1$ and the second transfer switch $SW_3$.

During a period after the above-described certain period (charge transfer period) in the period in which the control signal ϕtran has the high level, the control signal ϕtran2 has the low level, and the second transfer switches $SW_3$ are in the OFF state in all of the pixels. Further, the control signal ϕr has the high level, and the initialization switches $SW_4$ are in the ON state in all of the pixels. Thereby, in all of the pixels, the reference potential. Vref is applied to each photodiode via the initialization switch $SW_4$ and the transfer switch $SW_1$, and the charge accumulation in the junction capacitance portion of each photodiode is initialized.

The control signal ϕreset has the high level in a period in which the control signal ϕtran2 has the high level, and the control signal ϕreset also has the high level at a constant interval in the subsequent period (charge accumulation period) in which the control signal ϕtran2 has the low level. When the control signal ϕreset has the high level, the initialization switch $SW_{21}$ is in the ON state in each of the N integration circuits $21_1$ to $21_N$, and the charge accumulation in the capacitance portion $C_{21}$ is initialized.

Any one control signal ϕsel(m) of the control signals ϕsel(1) to ϕsel(M) has the high level in the period in which the control signal ϕreset has the low level. Thereby, the output switch $SW_2$ is in the ON state in each of the N pixels $P_{m,1}$ to $P_{m,N}$ of the m-th row to which the control signal ϕsel(m) having the high level is applied, and the charge accumulated in the capacitance portion $C_1$ is output as the charge signal out(n). The charge signal out(n) is input to the n-th integration circuit $21_n$ and accumulated in the capacitance portion $C_{21}$, and a voltage value according to the amount of accumulated charge is output from the integration circuit $21_n$.

That is, before the charge accumulation period, the control unit 30 initializes the charge accumulation in the junction capacitance portion of each photodiode PD by setting the initialization switches $SW_4$ and the transfer switches $SW_1$ in all of the pixels to the ON state. After the initialization, the control unit 30 causes the charge generated according to the light incidence to be accumulated in the junction capacitance portion of each photodiode PD in all of the pixels during the common charge accumulation period. After the charge accumulation period, the control unit 30 causes the charge to be transferred from the junction capacitance portion of each photodiode PD to the capacitance portion $C_1$ by setting the transfer switches $SW_1$ and the second transfer switches $SW_3$ in all of the pixels to the ON state. Then, after the charge is transferred, the control unit 30 causes the charge to be output from the capacitance portion $C_1$ to the signal readout unit 20 by sequentially setting the output switches $SW_2$ to the ON state for respective rows. The control unit 30 can cause the charge to be output from the capacitance portion $C_1$ of each pixel to the signal readout unit 20 in the charge accumulation period in which the charge is accumulated in the junction capacitance portion of each photodiode PD.

In the second embodiment also, advantageous effects similar to those of the first embodiment can be obtained. In addition, in the second embodiment, it is possible to reduce an influence of charges remaining in the junction capacitance portion and the parasitic capacitance portion by providing the initialization switch $SW_4$ for initializing the charge accumulation in the junction capacitance portion of the photodiode PD in each pixel.

Third Embodiment

A solid-state imaging device 3 of the third embodiment is similar to the solid-state imaging device 1 of the first embodiment in terms of the entire configuration illustrated in FIG. 1, the examples of the cross-sectional structures illustrated in FIG. 5 and FIG. 6, and the layout regions of the photodiode PD and the capacitance portion $C_1$ illustrated in FIG. 7. However, the solid-state imaging device 3 of the third embodiment is different from the solid-state imaging device 1 of the first embodiment in terms of the circuit configuration of each pixel $P_{m,n}$.

Figure 12:
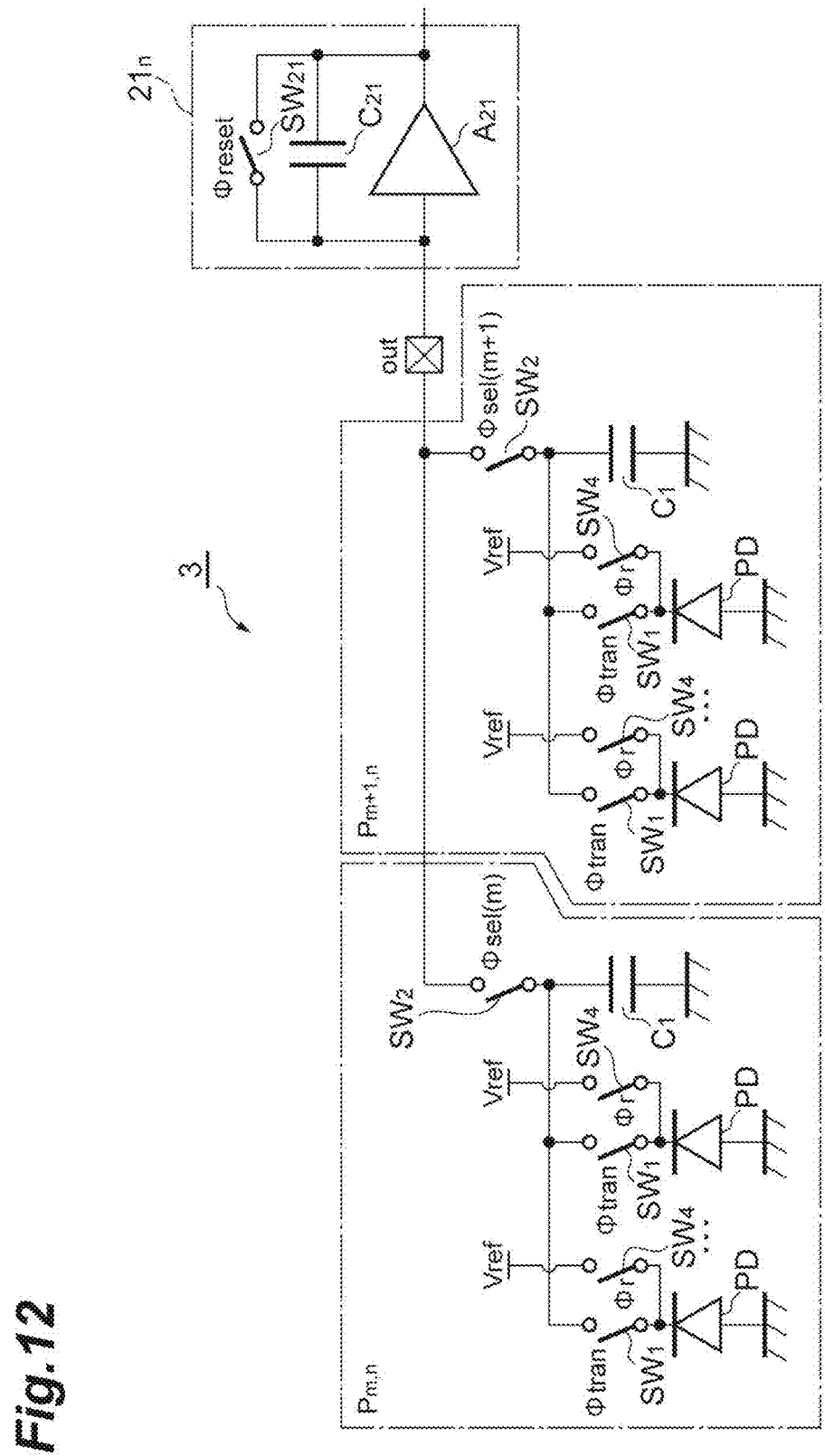
FIG. 12 is a circuit diagram of a pixel $P_{m,n}$ and an integration circuit $21_n$ of a solid-state imaging device 3 of a third embodiment.

FIG. 12 is a circuit diagram of a pixel $P_{m,n}$ and an integration circuit $21_n$ of the solid-state imaging device 3 of the third embodiment. FIG. 12 illustrates two pixels $P_{m,n}$ and $O_{m+1,n}$ of an n-th column as representatives of M×N pixels $P_{1,1}$ to $P_{M,N}$, and illustrates an n-th integration circuit $21_n$ as a representative of N integration circuits $21_1$ to $21_N$.

The pixel $P_{m,n}$ in the third embodiment illustrated in FIG. 12 is different from the pixel $P_{m,n}$ in the first embodiment illustrated in FIG. 2 in that an initialization switch $SW_4$ is further included. The initialization switch $SW_4$ may also be configured by a MOS transistor.

The initialization switch $SW_4$ is provided between a reference potential terminal to which a reference potential Vref is applied and a photodiode PD. The initialization switch $SW_4$ can initialize charge accumulation in a junction capacitance portion of each photodiode PD when the switch is in an ON state. An ON/OFF operation of the initialization switch $SW_4$ of each pixel $P_{m,n}$ is controlled by a control signal φr output from a control unit 30.

Figure 13:
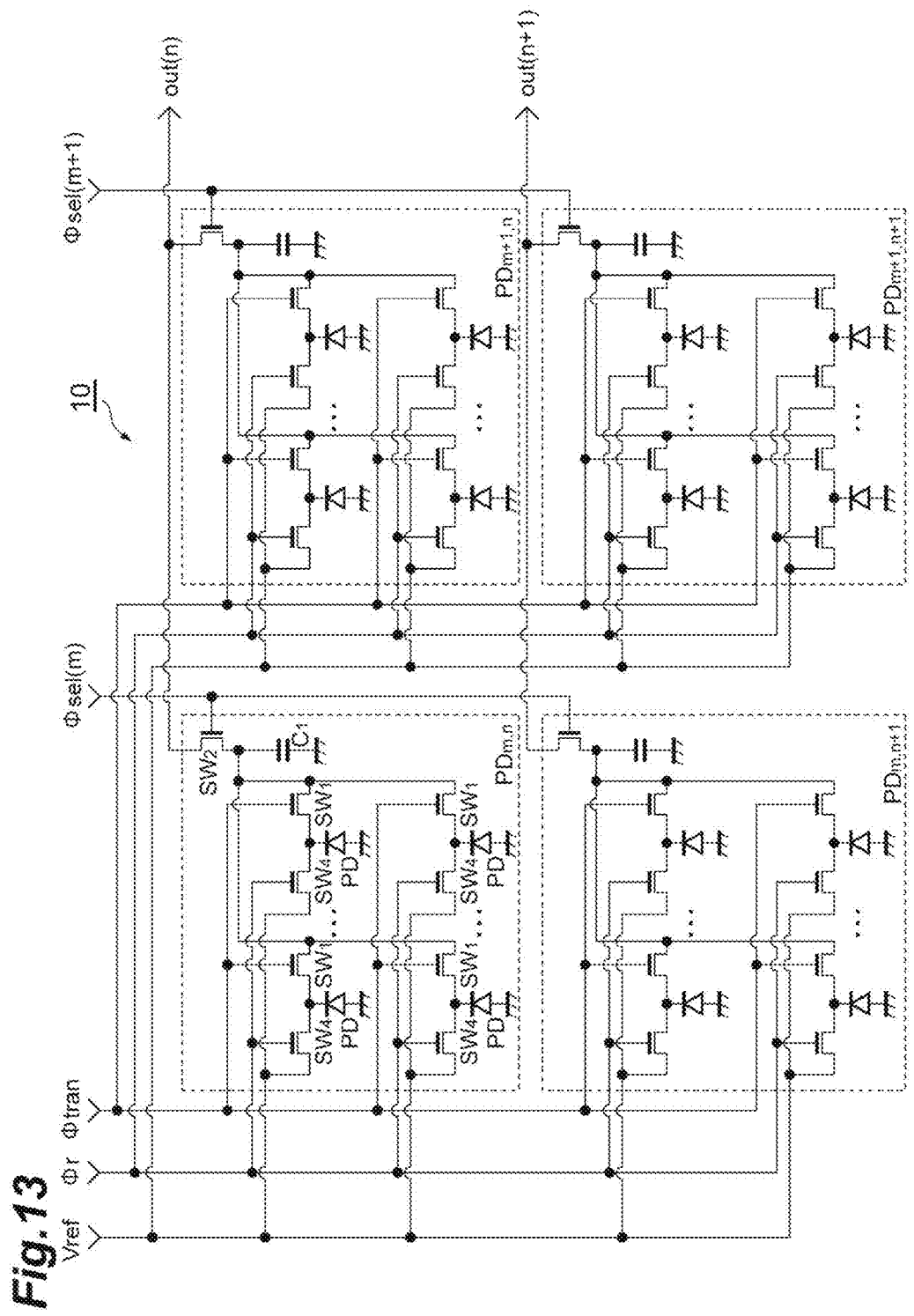
FIG. 13 is a circuit diagram of the pixel $P_{m,n}$, a pixel $P_{m+1,n}$, a pixel $P_{m,n+1}$, and a pixel $P_{m+1,n+1}$ of the solid-state imaging device 3 of the third embodiment and illustrates pixels of two rows and two columns as representatives of M rows and N columns.

FIG. 13 is a circuit diagram of the pixel $P_{m,n}$, the pixel $P_{m+1,n}$, a pixel $P_{m,n+1}$, and a pixel $P_{m+1,n+1}$ of the solid-state imaging device 3 of the third embodiment. FIG. 13 illustrates pixels of 2 rows and 2 columns as representatives of M rows and N columns.

A control signal φtran, a control signal φsel(m), and a charge signal out(n) are similar to those in the first embodiment. The control unit 30 applies the common control signal φr to the M×N pixels $P_{1,1}$ to $P_{M,N}$. The control signal φr is a signal for controlling ON/OFF operations of the initialization switches $SW_4$ of all of the pixels.

Figure 14:
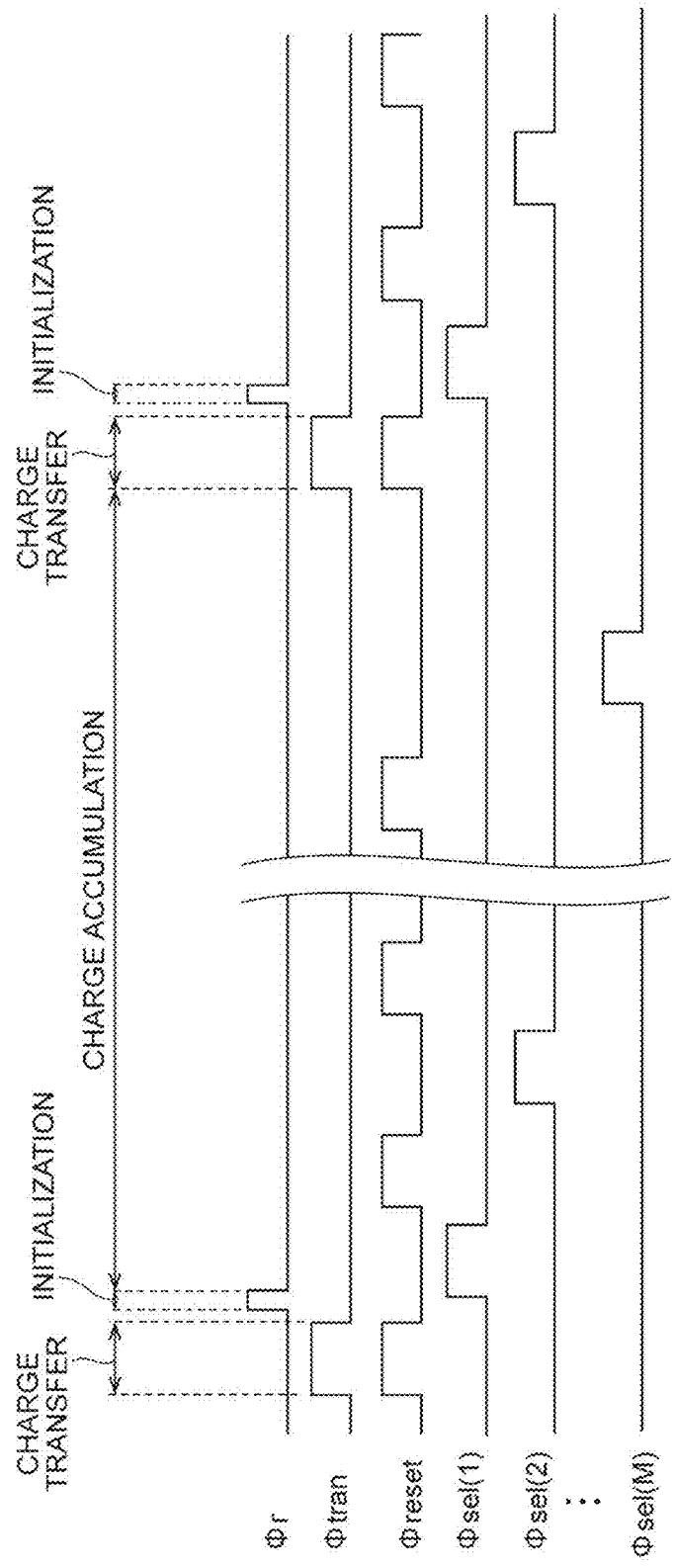
FIG. 14 is a timing chart illustrating an example of an operation of the solid-state imaging device 3 of the third embodiment.

FIG. 14 is a timing chart illustrating an example of an operation of the solid-state imaging device 3 of the third embodiment. FIG. 14 illustrates the control signal φr to be applied to the initialization switch $SW_4$ of each pixel $P_{m,n}$, the control signal φtran to be applied to the transfer switch $SW_1$ of each pixel $P_{m,n}$, the control signal φreset to be applied to the initialization switch $SW_{21}$ of each integration circuit $21_n$, and the control signals φsel(1) to φsel(M) to be applied to the output switch $SW_2$ of the pixel $P_{m,n}$ of each row. Each switch is assumed to be in the ON state when the applied control signal has a high level.

In the present embodiment, during a certain period after a time at which the control signal φtran changes to a low level, the control signal φr has the high level and the initialization switches $SW_4$ are in the ON state in all of the pixels. Thereby, in all of the pixels, the reference potential Vref is applied to each photodiode via the initialization switch $SW_4$ and the charge accumulation in the junction capacitance portion of each photodiode is initialized.

During a period (charge accumulation period) from a time at which the control signal φr changes to the low level to a time at which the control signal φtran changes to the high level, in all of the pixels, each transfer switch $SW_1$ and each initialization switch $SW_4$ are in an OFF state, and the charge generated according to the light incidence on each photodiode PD is accumulated in the junction capacitance portion of the photodiode PD.

During a period in which the control signal φtran has the high level, the transfer switches $SW_1$ are in the ON state in all of the pixels, and further, the control signals φsel(1) to φsel(M) have the low level, and the output switches $SW_2$ are in the OFF state in all of the pixels. Thereby, in all of the pixels, the charge accumulated until then in the junction capacitance portion of each photodiode PD is transferred to the capacitance portion $C_1$ via the transfer switch $SW_1$.

The control signal φreset has the high level in a period in which the control signal φtran has the high level, and the control signal φreset also has the high level at a constant interval in a subsequent period in which the control signal φtran has the low level. When the control signal φreset has the high level, the initialization switch $SW_{21}$ is in the ON state in each of the N integration circuits $21_1$ to $21_N$, and the charge accumulation in the capacitance portion $C_{21}$ is initialized.

Any one control signal φsel(m) of the control signals φsel(1) to φsel(M) has the high level in the period in which the control signal φreset has the low level. Thereby, the output switch $SW_2$ is in the ON state in each of the N pixels $P_{m,1}$ to $P_{m,N}$ of the m-th row to which the control signal φsel(m) having the high level is applied, and the charge accumulated in the capacitance portion $C_1$ is output as the charge signal out(n). The charge signal out(n) is input to the n-th integration circuit $21_n$ and accumulated in the capacitance portion $C_{21}$, and a voltage value according to the amount of accumulated charge is output from the integration circuit $21_n$.

That is, before the charge accumulation period, the control unit 30 initializes the charge accumulation in the junction capacitance portion of each photodiode PD by setting the initialization switches $SW_4$ in all of the pixels to the ON state. After the initialization, the control unit 30 causes the charge generated according to the light incidence to be accumulated in the junction capacitance portion of each photodiode PD in all of the pixels during the common charge accumulation period. After the charge accumulation period, the control unit 30 causes the charge to be transferred from the junction capacitance portion of each photodiode PD to the capacitance portion $C_1$ by setting the transfer switches $SW_1$ in all of the pixels to the ON state. Then, after the charge is transferred, the control unit 30 causes the charge to be output from the capacitance portion $C_1$ to the signal readout unit 20 by sequentially setting the output switches $SW_2$ to the ON state for respective rows. The control unit 30 can cause the charge to be output from the capacitance portion $C_1$ of each pixel to the signal readout unit 20 in the charge accumulation period in which the charge is accumulated in the junction capacitance portion of each photodiode PD. In the third embodiment also, advantageous effects similar to those of the second embodiment can be obtained.

Fourth Embodiment

A solid-state imaging device 4 of the fourth embodiment is different from those of the above-described first to third embodiments in that a signal readout unit 20 is provided on a support substrate 50.

Figure 15:
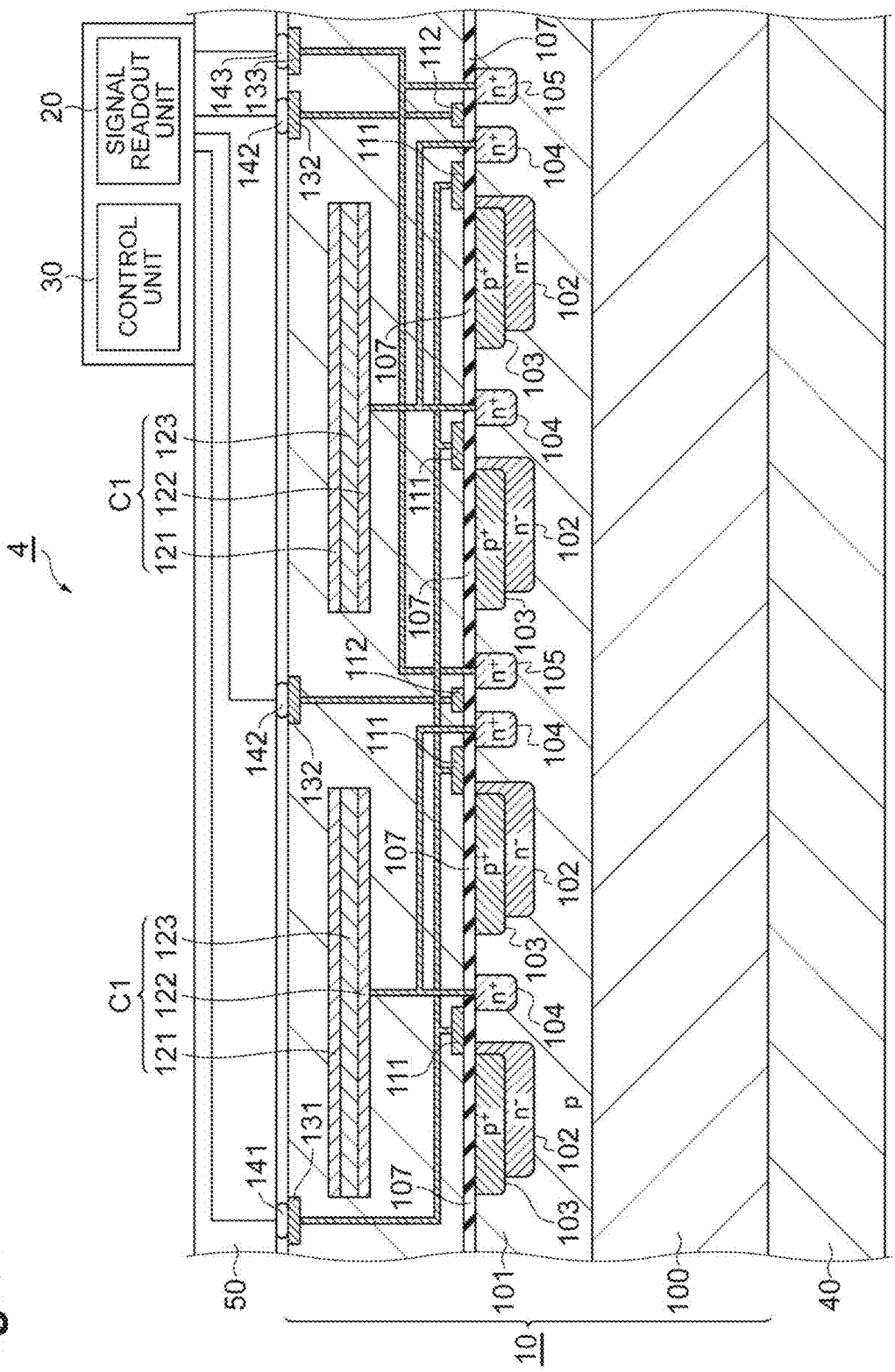
FIG. 15 is a diagram illustrating an example of a cross-sectional structure of a solid-state imaging device 4 of a fourth embodiment.

FIG. 15 is a diagram illustrating an example of a cross-sectional structure of the solid-state imaging device 4 of the fourth embodiment. In the present embodiment, the signal readout unit 20 and a control unit 30 are provided on the support substrate 50. The signal readout unit 20 and the control unit 30 may be provided on the support substrate 50 in a state of a chip or may be provided on the support substrate 50 in a state in which the units are placed in a package. In the present embodiment, because wiring between the photodetecting unit 10, the signal readout unit 20, and the control unit 30 can be shortened, there is an effect of noise reduction.

Fifth Embodiment

A solid-state imaging device 5 of the fifth embodiment is different from those of the above-described first to third embodiments in that a signal readout unit 20 is provided on a first principal surface of a semiconductor substrate 100.

Figure 16:
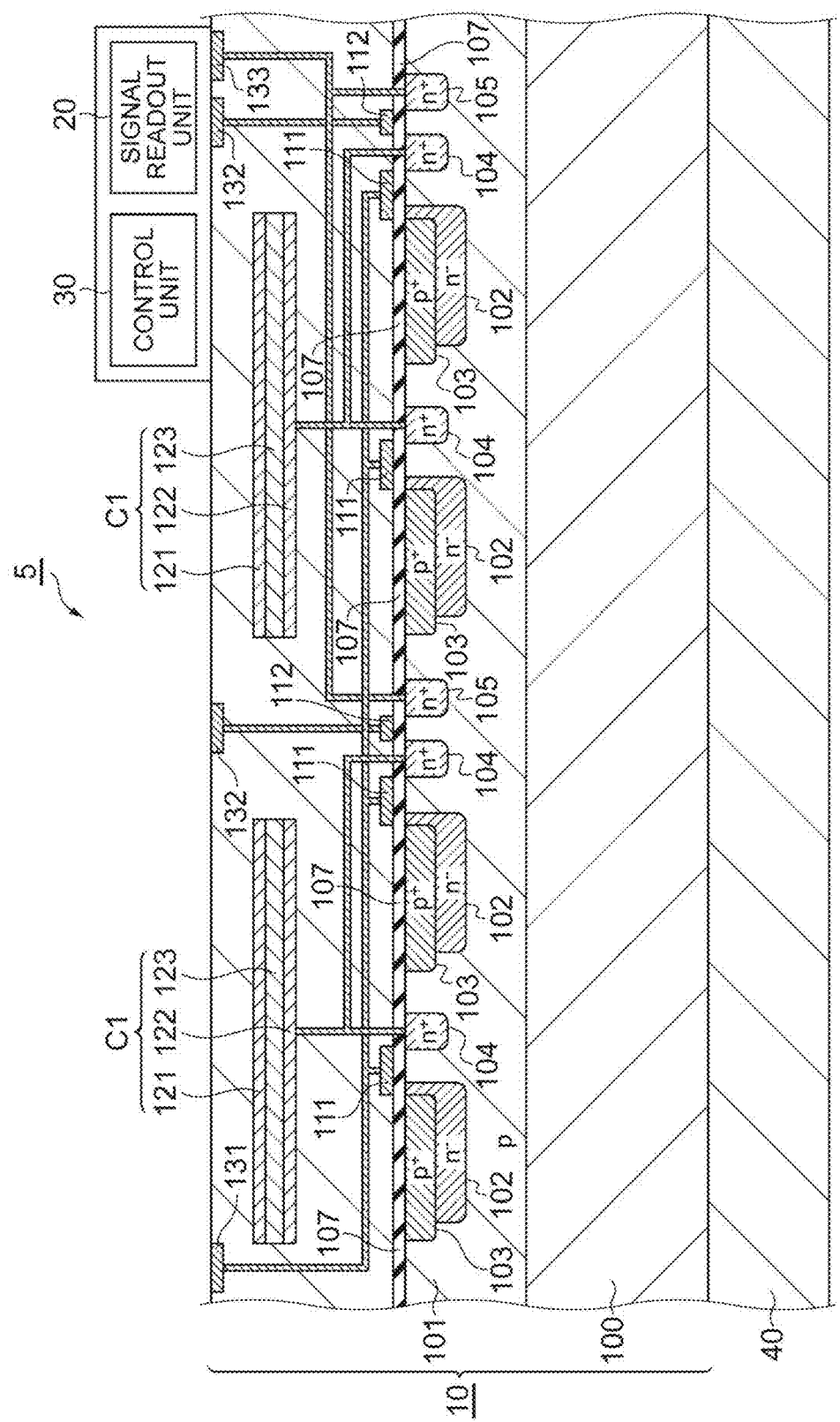
FIG. 16 is a diagram illustrating an example of a cross-sectional structure of a solid-state imaging device 5 of a fifth embodiment.

FIG. 16 is a diagram illustrating an example of a cross-sectional structure of the solid-state imaging device 5 of the fifth embodiment. In the present embodiment, the signal readout unit 20 and a control unit 30 are provided on the first principal surface of the semiconductor substrate 100. The signal readout unit 20 and the control unit 30 are connected to a photodetecting unit 10 via a bump. In the present embodiment also, because wiring between the photodetecting unit 10, the signal readout unit 20, and the control unit 30 can be shortened, there is an effect of noise reduction.

Sixth Embodiment

A solid-state imaging device 6 of the sixth embodiment is different from those of the above-described first to third embodiments in that a light detection region of a photodiode PD of each pixel is selectively thinned in a second principal surface side of a semiconductor substrate 100.

Figure 17:
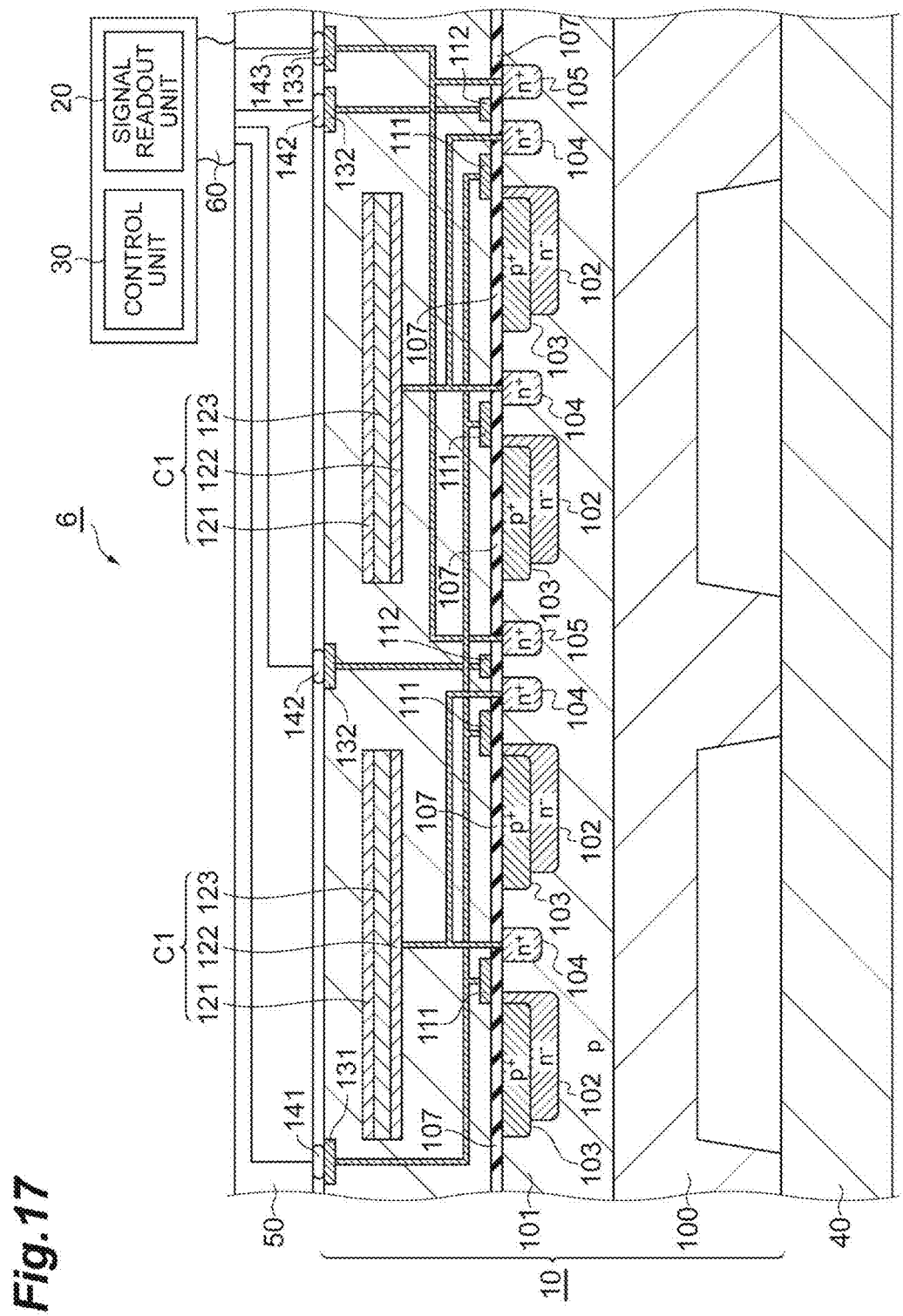
FIG. 17 is a diagram illustrating an example of a cross-sectional structure of a solid-state imaging device 6 of a sixth embodiment.

FIG. 17 is a diagram illustrating an example of a cross-sectional structure of the solid-state imaging device 6 of the sixth embodiment. In the present embodiment, because the light detection region of the photodiode PD of each pixel is selectively thinned on the second principal surface (a lower surface in FIG. 17) side of the semiconductor substrate 100, and therefore loss when light incident from the second principal surface side passes through the semiconductor substrate 100 is reduced, the photodiode PD can detect light with high sensitivity.

The solid-state imaging device according to the present invention is not limited to the above-described embodiments and configuration examples, and various modifications are possible.

The solid-state imaging device according to the above-described embodiment is configured to include a photodetecting unit including a plurality of pixels on a first principal surface of a semiconductor substrate having the first principal surface and a second principal surface opposite to each other; a signal readout unit outputting a signal value according to an amount of charge output from each of the plurality of pixels; and a control unit controlling an operation of each of the photodetecting unit and the signal readout unit. Further, in the solid-state imaging device, each of the plurality of pixels includes a plurality of buried photodiodes each of which generates a charge according to light incidence and accumulates the charge in a junction capacitance portion; a capacitance portion accumulating the charge transferred from the junction capacitance portion of each of the plurality of photodiodes; a transfer switch group for transferring the charge from the junction capacitance portion of each of the plurality of photodiodes to the capacitance portion; and an output switch for outputting the charge from the capacitance portion to the signal readout unit. Further, in the solid-state imaging device, the control unit performs control so as to accumulate the charge generated according to the light incidence in each of the plurality of pixels in the junction capacitance portion of each photodiode during a common charge accumulation period, transfer the charge from the junction capacitance portion of each photodiode to the capacitance portion by setting the transfer switch group to an ON state in each of the plurality of pixels after the charge accumulation period, and output the charge from the capacitance portion to the signal readout unit by sequentially setting the output switch to an ON state in each of the plurality of pixels after charge transfer.

In the above-described solid-state imaging device, the capacitance portion may be provided on the first principal surface of the semiconductor substrate and may be configured such that an insulator layer is sandwiched between a first conductor layer and a second conductor layer.

Further, in the above-described solid-state imaging device, a layout region of the photodiode and a layout region of the capacitance portion may be configured to at least partially overlap each other in each of the plurality of pixels when viewed in a direction perpendicular to the first principal surface.

Further, in the above-described solid-state imaging device, each of the plurality of pixels may further include an initialization switch group for initializing charge accumulation in the junction capacitance portion of each of the plurality of photodiodes, and the control unit may control so as to initialize the charge accumulation in the junction capacitance portion of each photodiode by setting the initialization switch group to an ON state in each of the plurality of pixels before the charge accumulation period.

The above-described solid-state imaging device may further include a scintillator layer provided on the second principal surface side of the semiconductor substrate.

The above-described solid-state imaging device may further include a support substrate provided on the first principal surface side of the semiconductor substrate and supporting the semiconductor substrate. Further, in this case, the signal readout unit may be provided on the support substrate.

Further, in the above-described solid-state imaging device, the signal readout unit may be provided on the first principal surface of the semiconductor substrate.

Further, in the above-described solid-state imaging device, a light detection region of the photodiode of each of the plurality of pixels may be selectively thinned in the second principal surface side of the semiconductor substrate.

INDUSTRIAL APPLICABILITY

The present invention can be used as a solid-state imaging device which can shorten a charge readout time from a junction capacitance portion of a photodiode of each pixel and which has an excellent S/N ratio and linearity in light detection.

REFERENCE SIGNS LIST 1-6—solid-state imaging device, 10—photodetecting unit, 20—signal readout unit, $21_1$-$21_N$—integration circuit, $22_1$-$22_N$—hold circuit, 23—AD conversion circuit, 30—control unit, 40—scintillator layer, 50—support substrate, 60—cable, 100—semiconductor substrate, 101—first semiconductor region, 102—second semiconductor region, 103—third semiconductor region, 104—fourth semiconductor region, 105—fifth semiconductor region, 107—insulator layer, 111, 112—gate electrode, 121—first conductor layer, 122—second conductor layer, 123—insulator layer, 131-133—electrode pad, 141-143—bump, $P_{1,1}$-$P_{M,N}$—pixel, PD—buried photodiode, $C_1$—capacitance portion, $SW_1$—transfer switch (transfer switch group), $SW_2$—output switch, $SW_3$—second transfer switch, $SW_4$—initialization switch (initialization switch group), $A_{21}$—amplifier, $C_{21}$—capacitance portion, $SW_{21}$—initialization switch.

The invention claimed is:

1. A solid-state imaging device comprising:
a photodetecting unit including a plurality of pixels on a first principal surface of a semiconductor substrate having the first principal surface and a second principal surface opposite to each other;
a signal readout unit outputting a signal value according to an amount of charge output from each of the plurality of pixels; and
a control unit controlling an operation of each of the photodetecting unit and the signal readout unit, wherein
each of the plurality of pixels includes a plurality of buried photodiodes each of which generates a charge according to light incidence and accumulates the charge in a junction capacitance portion; a capacitance portion accumulating the charge transferred from the junction capacitance portion of each of the plurality of photodiodes; a transfer switch group for transferring the charge from the junction capacitance portion of each of the plurality of photodiodes to the capacitance portion; and an output switch for outputting the charge from the capacitance portion to the signal readout unit, and the control unit controls so as to accumulate the charge generated according to the light incidence in each of the plurality of pixels in the junction capacitance portion of each photodiode during a common charge accumulation period, transfer the charge from the junction capacitance portion of each photodiode to the capacitance portion by setting the transfer switch group to an ON state in each of the plurality of pixels after the charge accumulation period, and output the charge from the capacitance portion to the signal readout unit by sequentially setting the output switch to an ON state in each of the plurality of pixels after charge transfer.

2. The solid-state imaging device according to claim 1, wherein the capacitance portion is provided on the first principal surface of the semiconductor substrate and configured such that an insulator layer is sandwiched between a first conductor layer and a second conductor layer.

3. The solid-state imaging device according to claim 1, wherein a layout region of the photodiode and a layout region of the capacitance portion at least partially overlap each other in each of the plurality of pixels when viewed in a direction perpendicular to the first principal surface.

4. The solid-state imaging device according to claim 1, wherein each of the plurality of pixels further includes an initialization switch group for initializing charge accumulation in the junction capacitance portion of each of the plurality of photodiodes, and the control unit controls so as to initialize the charge accumulation in the junction capacitance portion of each photodiode by setting the initialization switch group to an ON state in each of the plurality of pixels before the charge accumulation period.

5. The solid-state imaging device according to claim 1, further comprising a scintillator layer provided on the second principal surface side of the semiconductor substrate.

6. The solid-state imaging device according to claim 1, further comprising a support substrate provided on the first principal surface side of the semiconductor substrate and supporting the semiconductor substrate.

7. The solid-state imaging device according to claim 6, wherein the signal readout unit is provided on the support substrate.

8. The solid-state imaging device according to claim 1, wherein the signal readout unit is provided on the first principal surface of the semiconductor substrate.

9. The solid-state imaging device according to claim 1, wherein a light detection region of the photodiode of each of the plurality of pixels is selectively thinned in the second principal surface side of the semiconductor substrate.

* * * * *